(12) United States Patent
Tanaka et al.

(10) Patent No.: US 8,686,315 B2
(45) Date of Patent: Apr. 1, 2014

(54) LASER IRRADIATION METHOD AND LASER IRRADIATION DEVICE AND METHOD OF MANUFACTURING SEMICONDUCTOR DEVICE

(75) Inventors: Koichiro Tanaka, Atsugi (JP); Hidekazu Miyairi, Atsugi (JP); Aiko Shiga, Atsugi (JP); Akihisa Shimomura, Atsugi (JP); Atsuo Isobe, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1815 days.

(21) Appl. No.: 11/433,670

(22) Filed: May 15, 2006

(65) Prior Publication Data

US 2006/0215722 A1    Sep. 28, 2006

Related U.S. Application Data

(62) Division of application No. 10/252,828, filed on Sep. 24, 2002, now Pat. No. 7,138,306.

(30) Foreign Application Priority Data

Sep. 25, 2001  (JP) ................. 2001-292410
Oct. 25, 2001  (JP) ................. 2001-328371
Aug. 30, 2002  (JP) ................. 2002-256189

(51) Int. Cl.
*B23K 26/073* (2006.01)
*H01L 21/268* (2006.01)

(52) U.S. Cl.
USPC ............ 219/121.65; 219/121.73; 219/121.76

(58) Field of Classification Search
USPC ............ 219/121.65, 121.73, 121.66, 121.75, 219/121.76, 121.77; 438/487, 795
See application file for complete search history.

(56) References Cited

U.S. PATENT DOCUMENTS

| 3,992,682 A | 11/1976 | White et al. |
| 4,330,363 A | 5/1982 | Biegesen et al. |
| 4,410,237 A | 10/1983 | Veldkamp |

(Continued)

FOREIGN PATENT DOCUMENTS

| EP | 1162023 A2 * | 12/2001 |
| JP | 62-104117 | 5/1987 |

(Continued)

OTHER PUBLICATIONS

Search Report, Intellectual Property Office of Singapore, dated Jul. 6, 2004, for Application No. 200205715-6.

(Continued)

*Primary Examiner* — Geoffrey S Evans
(74) *Attorney, Agent, or Firm* — Eric J. Robinson; Robinson Intellectual Property Law Office, P.C.

(57) ABSTRACT

The present invention is characterized in that by laser beam being slantly incident to the convex lens, an aberration such as astigmatism or the like is occurred, and the shape of the laser beam is made linear on the irradiation surface or in its neighborhood. Since the present invention has a very simple configuration, the optical adjustment is easier, and the device becomes compact in size. Furthermore, since the beam is slantly incident with respect to the irradiated body, the return beam can be prevented.

43 Claims, 30 Drawing Sheets

(56) References Cited

U.S. PATENT DOCUMENTS

| | | | |
|---|---|---|---|
| 4,734,550 | A | 3/1988 | Imamura et al. |
| 4,779,943 | A | 10/1988 | Tatsuno et al. |
| 4,908,493 | A | 3/1990 | Susemihl |
| 4,997,468 | A * | 3/1991 | Dimitrov et al. ......... 219/121.82 |
| 5,204,694 | A | 4/1993 | Andrews |
| 5,204,696 | A | 4/1993 | Schmidlin et al. |
| 5,208,187 | A * | 5/1993 | Tsubouchi et al. ............ 438/607 |
| 5,304,357 | A | 4/1994 | Sato et al. |
| 5,361,269 | A | 11/1994 | Kamatani |
| 5,405,804 | A | 4/1995 | Yabe |
| 5,438,441 | A | 8/1995 | Rockstroh et al. |
| 5,521,107 | A | 5/1996 | Yamazaki et al. |
| 5,643,826 | A | 7/1997 | Ohtani et al. |
| 5,669,979 | A | 9/1997 | Elliott et al. |
| 5,708,252 | A | 1/1998 | Shinohara et al. |
| 5,754,328 | A | 5/1998 | Cobb et al. |
| 5,814,156 | A | 9/1998 | Elliott et al. |
| 5,828,481 | A | 10/1998 | Cobb et al. |
| 5,854,803 | A | 12/1998 | Yamazaki et al. |
| 5,893,990 | A | 4/1999 | Tanaka |
| 5,923,962 | A | 7/1999 | Ohtani et al. |
| 5,932,118 | A * | 8/1999 | Yamamoto et al. ...... 219/121.66 |
| 5,936,721 | A | 8/1999 | Ohtomo et al. |
| 5,953,597 | A | 9/1999 | Kusumoto et al. |
| 5,986,807 | A | 11/1999 | Fork |
| 6,013,928 | A | 1/2000 | Yamazaki et al. |
| 6,038,075 | A | 3/2000 | Yamazaki et al. |
| 6,071,765 | A * | 6/2000 | Noguchi et al. ............... 438/166 |
| 6,156,997 | A | 12/2000 | Yamazaki et al. |
| 6,159,777 | A | 12/2000 | Takenouchi et al. |
| 6,160,827 | A | 12/2000 | Tanaka |
| 6,204,099 | B1 | 3/2001 | Kusumoto et al. |
| 6,210,996 | B1 | 4/2001 | Yamazaki et al. |
| 6,229,115 | B1 | 5/2001 | Voss et al. |
| 6,242,291 | B1 | 6/2001 | Kusumoto et al. |
| 6,242,292 | B1 | 6/2001 | Yamazaki et al. |
| 6,248,606 | B1 | 6/2001 | Ino et al. |
| 6,249,385 | B1 | 6/2001 | Yamazaki et al. |
| 6,261,856 | B1 * | 7/2001 | Shinohara et al. ............ 438/487 |
| 6,265,745 | B1 | 7/2001 | Kusumoto et al. |
| 6,285,042 | B1 | 9/2001 | Ohtani et al. |
| 6,291,320 | B1 | 9/2001 | Yamazaki et al. |
| 6,335,541 | B1 | 1/2002 | Ohtani et al. |
| 6,410,373 | B1 | 6/2002 | Chang et al. |
| 6,433,301 | B1 | 8/2002 | Dunsky et al. |
| 6,441,965 | B2 | 8/2002 | Yamazaki et al. |
| 6,472,295 | B1 * | 10/2002 | Morris et al. ................. 438/463 |
| 6,521,473 | B1 | 2/2003 | Jung |
| 6,528,397 | B1 | 3/2003 | Taketomi et al. |
| 6,534,744 | B1 | 3/2003 | Yamazaki et al. |
| 6,535,535 | B1 | 3/2003 | Yamazaki et al. |
| 6,556,711 | B2 | 4/2003 | Koga et al. |
| 6,563,843 | B1 | 5/2003 | Tanaka |
| 6,573,161 | B1 | 6/2003 | Miyasaka et al. |
| 6,635,849 | B1 | 10/2003 | Okawa et al. |
| 6,693,257 | B1 | 2/2004 | Tanaka |
| 6,791,060 | B2 | 9/2004 | Dunsky et al. |
| 6,809,012 | B2 | 10/2004 | Yamazaki et al. |
| 6,844,523 | B2 | 1/2005 | Yamazaki et al. |
| 7,015,422 | B2 | 3/2006 | Timans |
| 7,160,764 | B2 | 1/2007 | Tanaka |
| 2001/0005019 | A1 * | 6/2001 | Ishikawa ........................ 257/59 |
| 2001/0036755 | A1 | 11/2001 | Tanaka |
| 2002/0094008 | A1 | 7/2002 | Tanaka |
| 2002/0151121 | A1 | 10/2002 | Tanaka |
| 2003/0021307 | A1 | 1/2003 | Yamazaki |
| 2003/0024905 | A1 | 2/2003 | Tanaka |
| 2003/0059990 | A1 | 3/2003 | Yamazaki |
| 2003/0080099 | A1 | 5/2003 | Tanaka et al. |
| 2003/0132205 | A1 | 7/2003 | Yamazaki et al. |
| 2003/0203549 | A1 | 10/2003 | Yamazaki et al. |
| 2005/0045604 | A1 * | 3/2005 | Talwar et al. ............ 219/121.76 |
| 2006/0215721 | A1 | 9/2006 | Tanaka et al. |
| 2007/0099401 | A1 | 5/2007 | Tanaka |
| 2007/0254392 | A1 | 11/2007 | Tanaka |

FOREIGN PATENT DOCUMENTS

| | | | |
|---|---|---|---|
| JP | 63-68287 A * | 3/1988 | |
| JP | 63-138991 U | 9/1988 | |
| JP | 01-173707 | 7/1989 | |
| JP | 01-173707 A * | 7/1989 | |
| JP | 01-239837 | 9/1989 | |
| JP | 02-181419 | 7/1990 | |
| JP | 03-210990 | 9/1991 | |
| JP | 7-183540 | 7/1995 | |
| JP | 08-195357 | 7/1996 | |
| JP | 09-043541 | 2/1997 | |
| JP | 09-102468 | 4/1997 | |
| JP | 09-260302 | 10/1997 | |
| JP | 09-281085 | 10/1997 | |
| JP | 10-197709 | 7/1998 | |
| JP | 10-223554 | 8/1998 | |
| JP | 2000-076678 | 3/2000 | |
| JP | 2000-269161 | 9/2000 | |
| JP | 2000-269161 A * | 9/2000 | |
| JP | 1 055 479 | 11/2000 | |
| JP | 1 083 590 | 3/2001 | |
| JP | 2001-156017 | 6/2001 | |
| JP | 2001-156018 | 6/2001 | |
| JP | 2001-250790 | 9/2001 | |
| JP | 2002-139697 | 5/2002 | |
| JP | 2002-141300 | 5/2002 | |
| JP | 2003-240932 | 8/2003 | |
| WO | WO-99/42228 A * | 8/1999 | |

OTHER PUBLICATIONS

Office Action (Application No. 200610006425.9) Dated Jul. 20, 2007.

Search Report (Application No. 200502879-0) Dated May 23, 2008.

European Search Report dated Feb. 24, 2005 for EP 02021768.3.

I. Indutnyi et al., *Holographic Optical Element Fabrication Using Chalcogenide Layers*, Optical Engineering, vol. 34, No. 4, Apr. 1995, pp. 1030-1038.

European Search Report dated May 4, 2005 for EP 02021768.3.

Search Report in counterpart Singapore Application No. 200204609-2 and Written Opinion dated Apr. 27, 2004, 12 pages.

Ishihara et al., "Location-Controlled Adjacent Grains Following Excimer-Laser Melting of Si Thin-Films," AM-LCD '98, Jan. 1, 1998, pp. 153-156.

Crowder et al., "Low-Temperature Single-Crystal Si TFT's Fabricated on Si Films Processed via Sequential Lateral Solidification," IEEE Electron Device Letters, vol. 19, No. 8, Aug. 1, 1998, pp. 306-308.

Hara et al., "Ultra-High Performance Poly-Si TFTs on a Glass by a Stable Scanning CW Laser Lateral Crystallization," AM-LCD '01, Jan. 1, 2001, pp. 227-230.

Takeuchi et al., "Performance of poly-Si TFTs fabricated by a Stable Scanning CW Laser Crystallization," AM-LCD '01, Jan. 1, 2001, pp. 251-254.

Computer Based Translation of Japan Patent No. 10-197709, published Mar. 9, 2009.

Office Action (Application No. 2002-0058161) Dated Aug. 18, 2009.

Office Action (Application No. 2009-0059655) Dated Sep. 28, 2009.

US 6,414,981, 07/2002, Tanaka (withdrawn)

* cited by examiner

FIG. 7
PLAN VIEW
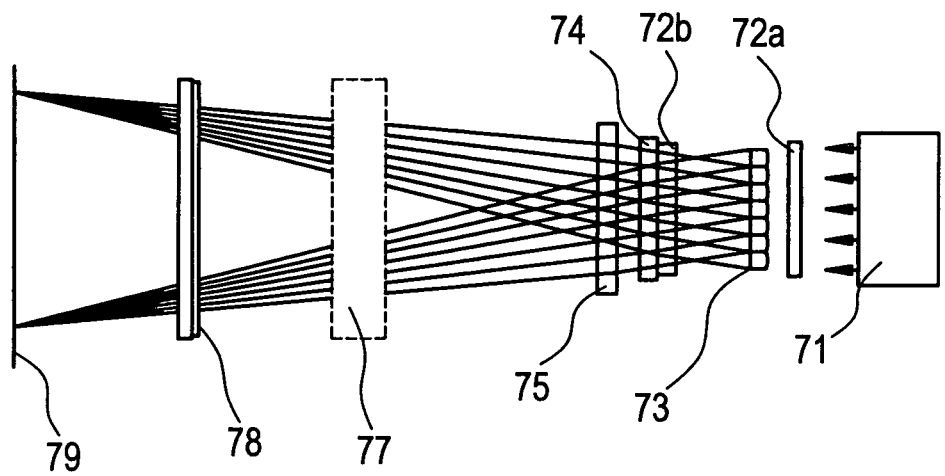
SIDE VIEW
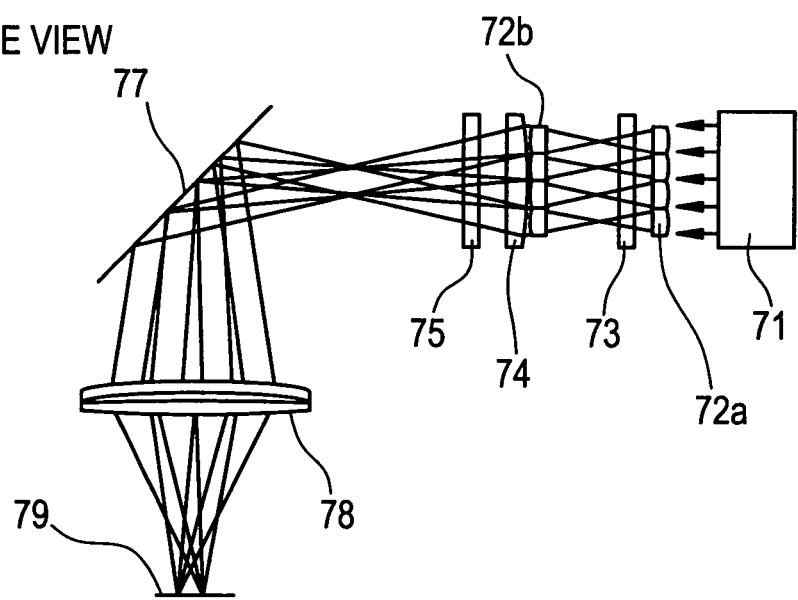

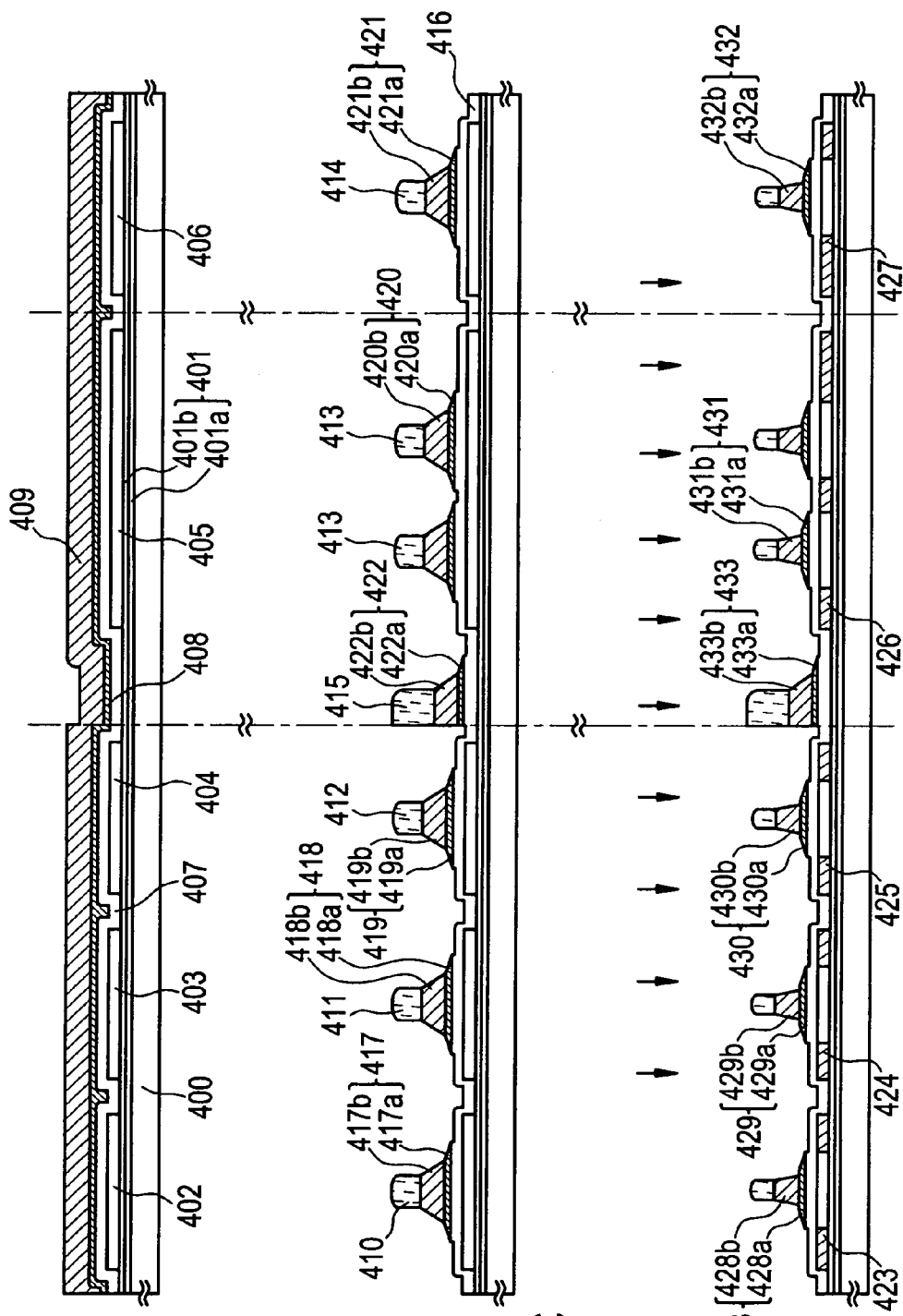

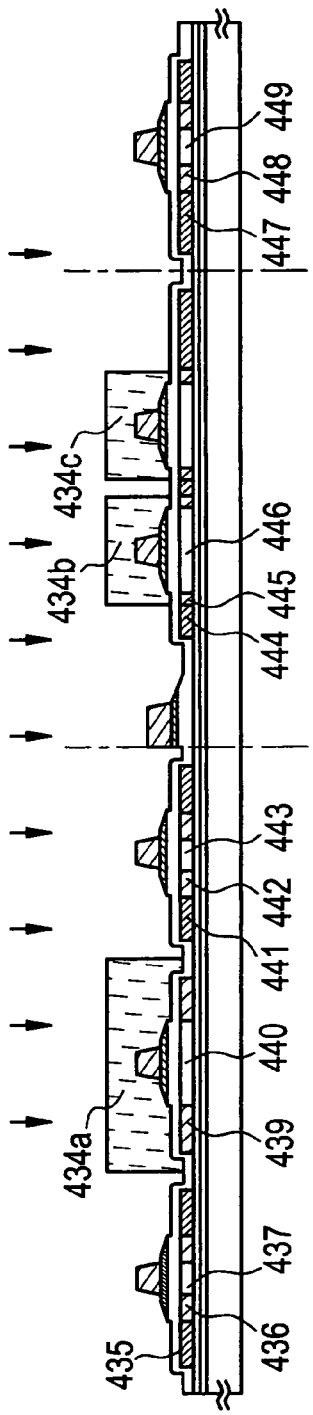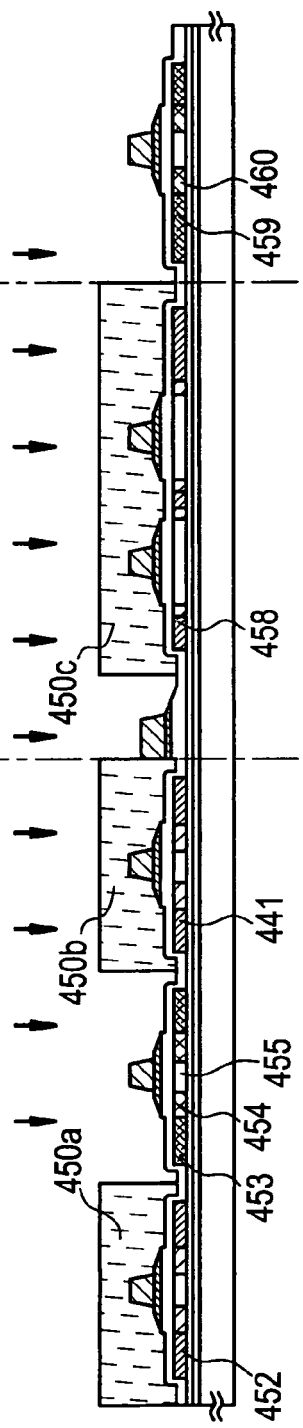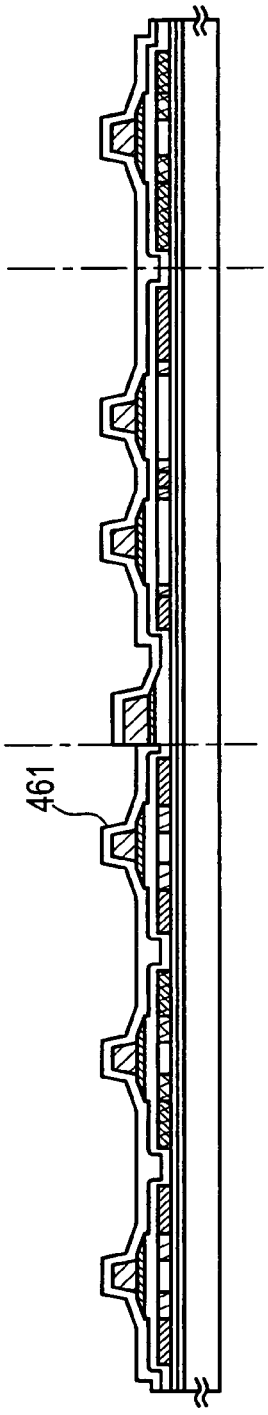

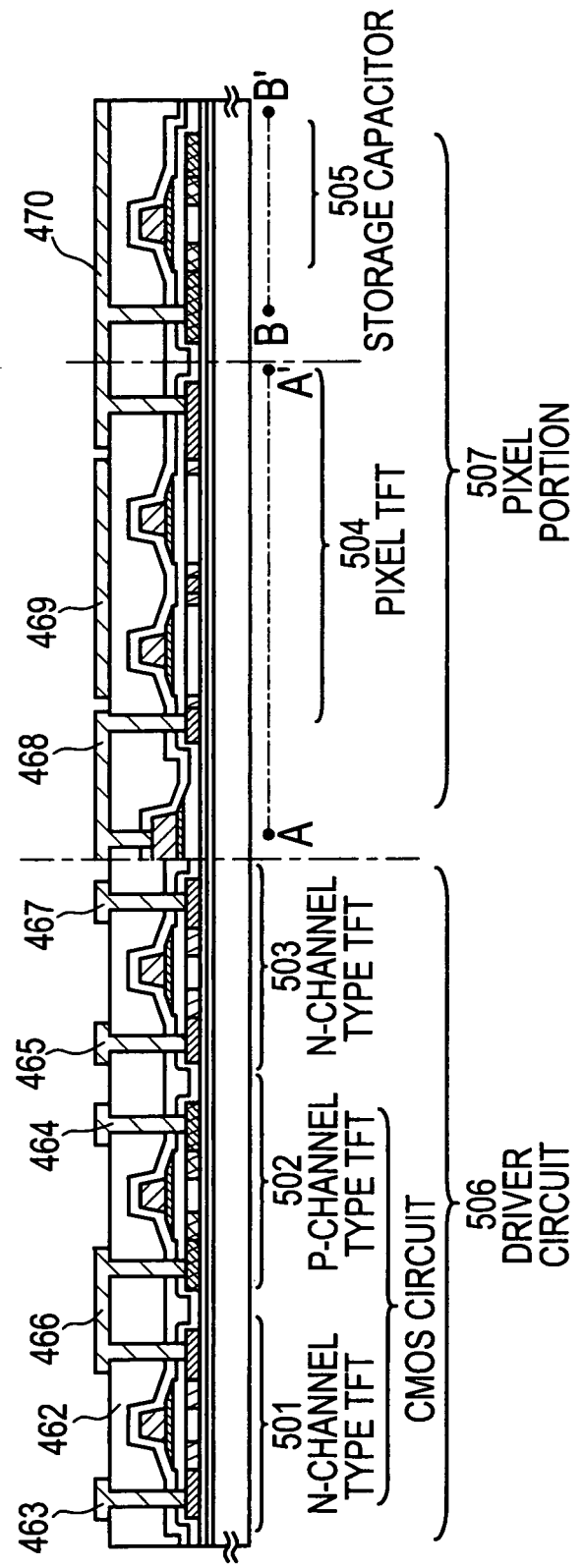

RELATIVE SCANNING DIRECTION OF LASER BEAM

RELATIVE SCANNING DIRECTION OF LASER BEAM

COMPLETE DEPLETION TYPE (THICKNESS OF SEMICONDUCTOR FILM IS 66nm)

PARTIAL DEPLETION TYPE (THICKNESS OF SEMICONDUCTOR FILM IS 150nm)

LASER IRRADIATION METHOD AND LASER IRRADIATION DEVICE AND METHOD OF MANUFACTURING SEMICONDUCTOR DEVICE

CROSS REFERENCE TO RELATED APPLICATIONS

This application is a divisional of U.S. application Ser. No. 10/252,828, now U.S. Pat. No. 7,138,306, filed on 24 Sep. 2002.

BACKGROUND OF THE INVENTION

1. Field of the Invention

The present invention relates to a laser irradiation method and a laser irradiation apparatus for using the method (apparatus including a laser and an optical system for guiding laser beam emitted from the laser to an object to be irradiated). In addition, the present invention relates to a method of manufacturing a semiconductor device, which includes a laser beam irradiation step. Note that a semiconductor device described here includes an electro-optical device such as a liquid crystal display device or a light emitting device and an electronic device which includes the electro-optical device as a part.

2. Description of the Related Art

In recent years, a wide study has been made on a technique in which laser annealing is performed for a semiconductor film formed on an insulating substrate made of glass or the like, to crystallize the film, to improve its crystallinity so that a crystalline semiconductor film is obtained, or to activate an impurity element. Note that a crystalline semiconductor film in this specification indicates a semiconductor film in which a crystallized region is present, and also includes a semiconductor film which is crystallized as a whole.

A method of forming pulse laser beam from an excimer laser or the like by an optical system such that it becomes a square spot of several cm or a linear shape of 100 mm or more in length on a surface to be irradiated, and scanning the laser beam (or relatively shifting an irradiation position of the laser beam with respect to the surface to be irradiated) to conduct annealing is superior in mass productivity and is excellent in technology. The "linear shape" described here means not a "line" in the strict sense but a rectangle (or a prolate ellipsoid shape) having a high aspect ratio. For example, it indicates a shape having an aspect ratio of 2 or more (preferably, 10 to 10000). Note that the linear shape is used to obtain an energy density required for sufficiently annealing an object to be irradiated.

FIG. 7 shows an example of a configuration of an optical system for forming laser beam in a linear shape on a surface to be irradiated. This configuration is extremely general. All optical systems described above are based on the configuration shown in FIG. 7. According to the configuration, a cross sectional shape of laser beam is converted into a linear shape, and simultaneously an energy density distribution of laser beam on the surface to be irradiated is homogenized. In general, an optical system for homogenizing the energy density distribution of laser beam is called a beam homogenizer.

Laser beam emitted from a laser 71 is divided in a direction perpendicular to a traveling direction thereof by a cylindrical lens group 73, thereby determining a length of linear laser beam in a perpendicular direction. The direction is called a first direction in this specification. It is assumed that, when a mirror is inserted in a course of an optical system, the first direction is changed in accordance with a direction of light bent by the mirror. In the configuration, the cylindrical lens array is divided into seven parts. Then, the laser beams are synthesized on a surface to be irradiated 79 by a cylindrical lens 74, thereby homogenizing an energy density distribution of the linear laser beam in the longitudinal direction.

Next, the configuration shown in the side view of FIG. 7 will be described. Laser beam emitted from a laser 71 is divided in a direction perpendicular to a traveling direction thereof and the first direction by cylindrical lens arrays 72a and 72b, thereby determining a length of linear laser beam in a width direction. The direction is called a second direction in this specification. It is assumed that, when a mirror is inserted in a course of an optical system, the second direction is changed in accordance with a direction of light bent by the mirror. In this configuration, the cylindrical lens arrays 72a and 72b each are divided into four parts. The divided laser beams are temporarily synthesized by a cylindrical lens 74. After that, the laser beams are reflected by a mirror 77 and then condensed by a doublet cylindrical lens 78 so that they become again single laser beam on the surface to be irradiated 79. The doublet cylindrical lens 78 is a lens composed of two cylindrical lenses. Thus, a homogenized energy density distribution of the linear laser beam in a width direction and a length of the linear laser beam in a width direction are determined.

For example, an excimer laser in which a size in a laser window is 10 mm×30 mm (which each are a half-width in beam profile) is used as the laser 71 and laser beam is produced by the optical system having the configuration shown in FIGS. 7A and 7B. Then, linear laser beam which has a uniform energy density distribution and a size of 125 mm×0.4 mm can be obtained on the surface to be irradiated 79.

At this time, when, for example, quartz is used for all base materials of the optical system, high transmittance is obtained. Note that coating is preferably conducted for the optical system such that transmittance of 99% or more is obtained at a frequency of the used excimer laser.

Then, the linear laser beam formed by the above configuration is irradiated with an overlap state while being gradually shifted in a width direction thereof. Thus, when laser annealing is performed for the entire surface of an amorphous semiconductor film, the amorphous semiconductor film can be crystallized, crystallinity can be improved to obtain a crystalline semiconductor film, or an impurity element can be activated.

SUMMARY OF THE INVENTION

However, as shown in FIG. 7, an optical system for forming a linear beam is complicated. There are problems that it is very difficult to perform optical adjustment to such an optical system, and in addition, since the footprint becomes larger, the device is enlarged.

Furthermore, in the case where a laser beam whose reflectance with respect to the irradiated body is high is used, when the foregoing laser beam is perpendicularly incident into the irradiated body, what is called a return beam is generated, which returns on the same optical path when the beam is incident into the irradiated body. The return beam becomes a factor having a bad influence on an output of the laser and the variation of frequencies and the destruction of the rod or the like.

Hence, an object of the present invention is to provide a laser irradiation device in which a linear beam is formed using an optical system more simplified than the conventional ones and which can effectively anneal using such a linear beam, and a laser irradiation method using such a laser irradiation device. Moreover, another object of the present invention is to provide a method of manufacturing a semiconductor device in which the foregoing laser irradiation method is included in its step.

The present invention is characterized in that an aberration such as an astigmatism or the like is generated by a laser beam being slantly incident with respect to the convex lens, and the shape of the laser beam on the irradiation surface or in its neighborhood is made in a linear.

The configuration of the invention relating to a laser irradiation device disclosed in the present specification is characterized in that it has a laser and a convex lens slantly set with respect to the traveling direction of the laser beam emitted from the foregoing laser and making the shape of the foregoing laser beam linear on the irradiation surface or in its neighborhood.

Moreover, as for the other configuration of the invention relating to a laser irradiation device, it is a laser irradiation device having a laser and a convex lens which is slantly set to the traveling direction of the laser beam emitted from the foregoing laser and makes the shape of the foregoing laser beam on the irradiation surface or in its neighborhood in a linear shape, it is characterized as follows: supposing that the beam width measured when a laser beam emitted from the laser via the foregoing convex lens is incident into the irradiated body formed on the substrate is w, and the thickness of the foregoing substrate is d, the foregoing laser beam is incident with respect to the foregoing irradiated body, at an incident angle $\theta$ satisfying the following expression:

$$\theta \geq \arctan(w/(2 \times d))$$

In the respective configurations described above, the foregoing laser is characterized in that it is a solid state laser, a gas laser, or a metal laser of continuous oscillation or pulse oscillation. It should be noted that as the foregoing solid state laser, YAG laser, $YVO_4$ laser, YLF laser, $YAlO_3$ laser, glass laser, ruby laser, alexandrite laser, Ti: sapphire laser or the like of continuous oscillation or pulse oscillation are listed, as the foregoing gas laser, excimer laser, Ar laser, Kr laser, $CO_2$ laser or the like of continuous oscillation or pulse oscillation are listed, and as the foregoing metal laser, helium-cadmium laser, copper vapor laser, gold vapor laser and the like are listed.

Moreover, in the respective configurations described above, it is desirable that the foregoing laser beam has been converted into a higher harmonic wave by a non-linear optical element. For example, it is known that a YAG laser emits a laser beam in the wavelength of 1065 nm as a fundamental wave. The absorption coefficient of this laser beam with respect to the silicon film is very low, so it is difficult from the technical viewpoint to crystallize an amorphous silicon film which is one of semiconductor films if it remains as it is. However, this laser beam can be converted into a shorter wavelength using a nonlinear optical element, and as a higher harmonic wave, the second higher harmonic wave (532 nm), the third higher harmonic wave (355 nm), the fourth higher harmonic wave (266 nm) and the fifth harmonic wave (213 nm) are listed. Since these higher harmonic waves have high absorption coefficients with respect to the amorphous silicon film, these can be utilized for crystallization of the amorphous silicon film.

Moreover, in the respective configurations described above, the foregoing convex lens is characterized in that it is an aspherical lens. Furthermore, as a convex lens, meniscus lens, biconvex lens, plano-convex lens and the like are listed, however, as the convex lens in the present invention, it may be any lens out of these lenses and the incident surface of the laser beam may be either of the two surfaces of the convex lens.

Moreover, in the configurations described above, for the foregoing substrate, a glass substrate, a quartz substrate, a silicon substrate, a plastic substrate, a metal substrate, a stainless clad substrate, a flexible substrate and the like can be utilized. As the foregoing glass substrate, a substrate consisted of glass such as barium borosilicate glass, aluminoborosilicate glass or the like can be listed. Moreover, a flexible substrate is referred to a substrate in a film shape consisted of PET, PES, PEN, acryl or the like, if a semiconductor device is prepared by utilizing the flexible substrate, the weight lightening of it is expected. If on the surface or on the surface and the back surface of the flexible substrate, a barrier layer made of aluminum film (AlON, AlN, AlO or the like), carbon film (DLC (diamond like carbon) or the like), SiN or the like is formed in a monolayer or multilayer, it is desirable that the durability or the like is enhanced.

Moreover, the configuration of the invention relating to a laser irradiation method disclosed in the present specification is characterized in that through a convex lens slantly set with respect to the traveling direction of the laser beam, a linear beam is formed on the irradiation surface or in its neighborhood, the foregoing linear beam irradiates while the foregoing linear beam is relatively moved with respect to the irradiated body. Moreover, the other configuration of the invention relating to a laser irradiation method is characterized in that, through a convex lens slantly set with respect to the traveling direction of the laser beam, a linear beam is formed on the irradiation surface or in its neighborhood. Supposing that a beam width measured when the foregoing linear beam is incident into the irradiated body formed on the substrate is w, and the thickness of the foregoing substrate is d, the foregoing linear beam is incident into the irradiated body, at the incident angle $\theta$ satisfying the following expression:

$$\theta \geq \arctan(w/(2 \times d))$$

and the foregoing linear beam irradiates while the foregoing linear beam is moved relatively to the foregoing irradiated body. In the respective configurations described above, the foregoing laser is characterized in that it is a solid state laser, a gas laser, or a metal laser of continuous oscillation or pulse oscillation. It should be noted that as the foregoing solid state laser, YAG laser, $YVO_4$ laser, YLF laser, $YAlO_3$ laser, glass laser, ruby laser, alexandrite laser, Ti: sapphire laser or the like of continuous oscillation or pulse oscillation are listed, as the foregoing gas laser, excimer laser, Ar laser, Kr laser, $CO_2$ laser or the like of continuous oscillation or pulse oscillation are listed, and as the foregoing metal laser, helium-cadmium laser, copper vapor laser, gold vapor laser and the like are listed. Moreover, in the respective configurations described above, it is desirable that the foregoing laser beam has been converted into a higher harmonic wave by a non-linear optical element. Moreover, in the respective configurations described above, the foregoing convex lens is characterized in that it is an aspherical lens. Furthermore, as a convex lens, meniscus lens, biconvex lens, plano-convex lens and the like are listed, however, as the convex lens in the present invention, it may be any lens out of these lenses and the incident surface of the laser beam may be either of the two surfaces of the convex lens.

Moreover, in the configurations described above, for the foregoing substrate, a glass substrate, a quartz substrate, a silicon substrate, a plastic substrate, a metal substrate, a stainless clad substrate, a flexible substrate and the like can be utilized.

Moreover, the configuration of the invention relating to a method of manufacturing a semiconductor device disclosed in the present specification is characterized in that through a convex lens slantly set with respect to the traveling direction of the laser beam, a linear beam is formed on the irradiation surface or in its neighborhood, the foregoing linear beam irradiates while the foregoing linear beam is relatively moved with respect to the semiconductor film.

Moreover, the other configuration of the invention relating to a method of manufacturing a semiconductor device is characterized in that, through a convex lens slantly set with respect to the traveling direction of the laser beam, a linear beam is formed on the irradiation surface or in its neighborhood. Supposing that a beam width measured when the foregoing linear beam is incident into the semiconductor film formed on the substrate is w, and the thickness of the foregoing substrate is d, the foregoing linear beam is incident with respect to the semiconductor film at the incident angle θ satisfying the following expression:

$$\theta \geq \arctan(w/(2 \times d))$$

and the foregoing linear beam irradiates while the foregoing linear beam is moved relatively to the foregoing semiconductor film.

In the respective configurations described above, the foregoing laser is characterized in that it is a solid state laser, a gas laser, or a metal laser of continuous oscillation or pulse oscillation. It should be noted that as the foregoing solid state laser, YAG laser, $YVO_4$ laser, YLF laser, $YAlO_3$ laser, glass laser, ruby laser, alexandrite laser, Ti: sapphire laser or the like of continuous oscillation or pulse oscillation are listed, as the foregoing gas laser, excimer laser, Ar laser, Kr laser, $CO_2$ laser or the like of continuous oscillation or pulse oscillation are listed, and as the foregoing metal laser, helium-cadmium laser, copper vapor laser, gold vapor laser and the like are listed. Moreover, in the respective configurations described above, it is desirable that the foregoing laser beam has been converted into a higher harmonic wave by a non-linear optical element. Moreover, in the respective configurations described above, the foregoing convex lens is characterized in that it is an aspherical lens. Furthermore, as a convex lens, meniscus lens, biconvex lens, plano-convex lens and the like are listed, however, as the convex lens in the present invention, it may be any lens out of these lenses and the incident surface of the laser beam may be either of the two surfaces of the convex lens.

Moreover, in the configurations described above, for the foregoing substrate, a glass substrate, a quartz substrate, a silicon substrate, a plastic substrate, a metal substrate, a stainless clad substrate, a flexible substrate and the like can be utilized.

Moreover, in the respective configurations, it is desirable that the foregoing semiconductor film is a film containing silicon. Since the present invention has a very simplified configuration, optical adjustment is easy, and the device becomes compact in size. Moreover, even in the case where the irradiation is performed using a plurality of laser beams, since the optical system is simplified, it is possible to easily make the same shape of the all laser beams. In order to perform the uniform annealing, it is very important to make the same shape of plurality of laser beams. If the beam irradiates on a substrate having a large area using such a plurality of laser beams, it is capable of enhancing the throughput. Moreover, the beam can be utilized by synthesizing such a plurality of lasers. Furthermore, since the present invention is slantly incident with respect to the irradiated body, the return beam can be prevented, since an isolator is not required to set, the configuration becomes more simplified. Therefore, the reduction of the cost can be realized. Moreover, the efficient irradiation can be performed with respect to the semiconductor film formed on the substrate, and it makes possible that the variation of the electrical property of TFT prepared can be reduced using such a semiconductor. Then, the operating property and reliability of semiconductor prepared from such a TFT can be also enhanced.

BRIEF DESCRIPTION OF THE DRAWINGS

In the a accompanying drawings:

FIG. 7 is a diagram showing an example of a conventional optical system;

FIGS. 8A to 8C are cross sectional views for explaining steps of manufacturing a pixel TFT and a TFT for a driver circuit;

FIGS. 9A to 9C are cross sectional views for explaining steps of manufacturing a pixel TFT and a TFT for a driver circuit;

FIG. 10 is a cross sectional view for explaining a step of manufacturing a pixel TFT and a TFT for a driver circuit;

DETAILED DESCRIPTION OF THE PREFERRED EMBODIMENTS

Embodiment Mode

Figure 1:
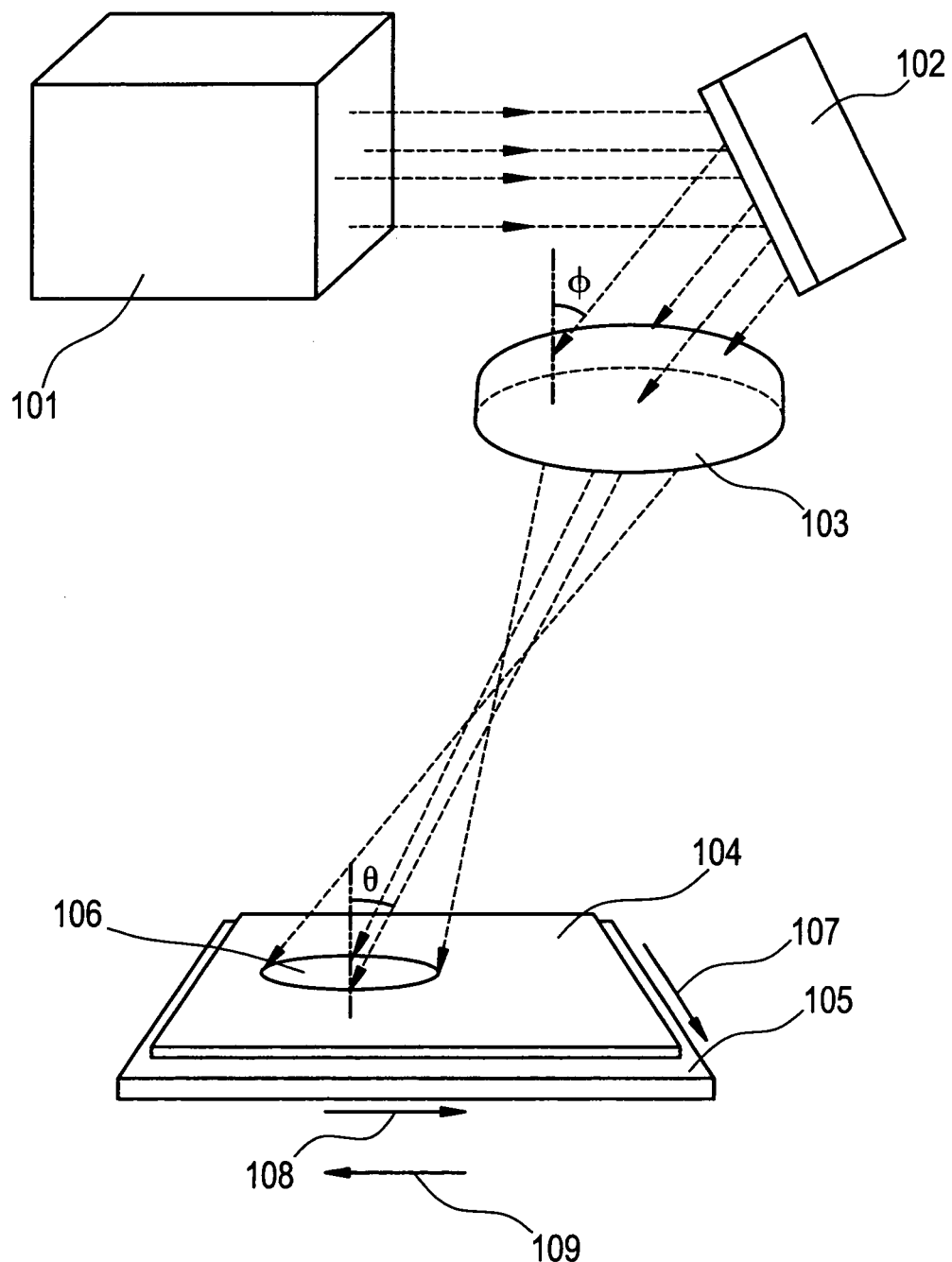
FIG. 1 is a diagram for showing an example of an optical system of the present invention.
Figure 2:
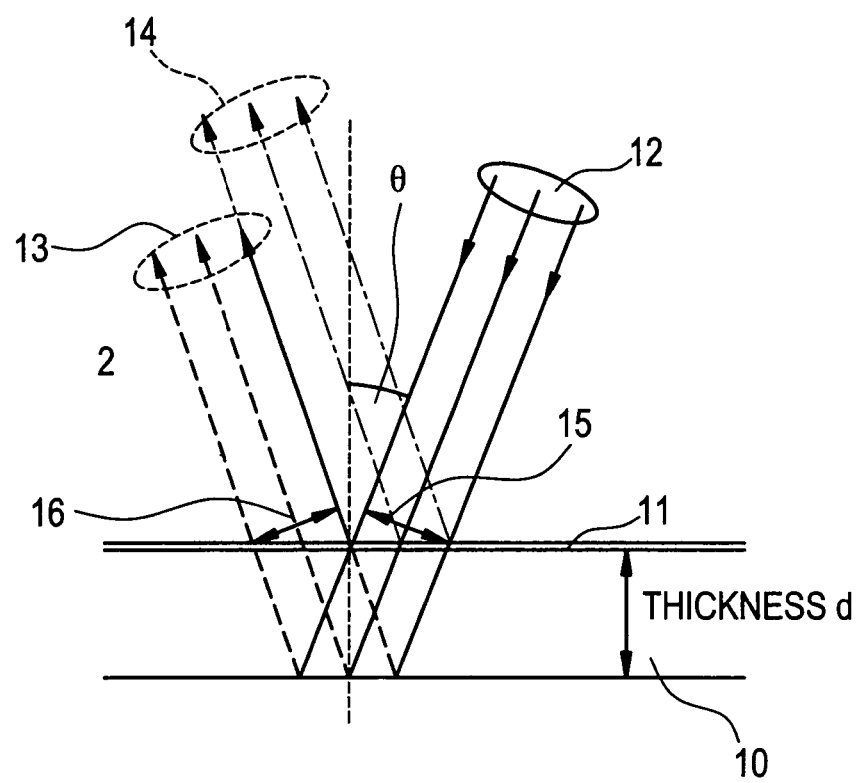
FIG. 2 is a diagram for obtaining an incident angle θ of a laser beam with respect to an object to be irradiated.

In the present Embodiment Mode, a method of forming a linear beam will be described below with reference to FIG. 1 and FIG. 2.

A laser beam emitted from a laser 101 is incident into a convex lens 103 via a mirror 102. Here, as the laser 101, a solid state laser, a gas laser or a metal laser of continuous oscillation or pulse oscillation is used. It should be noted that as the foregoing solid state laser, YAG laser, YVO$_4$ laser, YLF laser, YAlO$_3$ laser, glass laser, ruby laser, alexandrite laser, Ti:sapphire laser and the like are listed, as the foregoing gas laser, excimer laser, Ar laser, Kr laser, CO$_2$ laser and the like of continuous oscillation or pulse oscillation are listed, and as the foregoing metal laser, helium-cadmium laser, copper vapor laser, gold vapor laser and the like are listed. Then, a laser oscillated from the laser 101 may be converted into a higher harmonic wave by a non-linear optical element. Moreover, a beam expander between the laser 101 and the mirror 102 or between the mirror 102 and the convex lens 103 is set and may be expanded into the desired size in both of longer direction and shorter direction, respectively. The beam expander is particularly effective in the case where the shape of the laser beam emitted from the laser is small. Moreover, the mirror may not be set, or a plurality of the mirrors may be set.

The laser beam is made slantly incident with respect to the convex lens 103. The focal position is shifted with aberration such as astigmatism by being incident in such a way, a linear beam 106 can be formed on the irradiation surface or in its neighborhood. It should be noted that if the convex lens 103 is made of a synthetic quartz glass, it is desired since a high transparency is obtained. Moreover, as for the coating provided on the surface of the convex lens 103, it is desirable that one capable of obtaining the transparency of 99% or more with respect to the wavelength of the utilized laser beam is used. Moreover, as for the convex lens, it is desirable that an aspherical lens whose spherical lens aberration is corrected is used. If an aspherical lens is used, the condensing property is enhanced, and the aspect ratio and the distribution of the energy density are also enhanced.

Then, while the linear beam 106 formed thus irradiates, for example, it can irradiate the desired region or whole area on the irradiated body 104 by being relatively moved with respect to the irradiated body 104, for example, in the direction indicated with the reference numeral 107 or the directions indicated with the reference numerals 108, 109. "To be relatively moved" is concretely referred to "to operate the irradiated body disposed on the stage".

However, depending on the wavelength of a laser beam, the interference may arise between the reflection beam on the surface of the irradiated body 104 and the reflection beam on the back surface of the substrate 105 on which the irradiated body 104 is formed. In FIG. 2, as the irradiated body 104, an example in which a semiconductor 11 is formed on a substrate 10 is shown. If the reflection beam 14 on the surface of the semiconductor film 11 and the reflection beam 13 on the back surface of the substrate 10 are not superimposed, the interference due to these beams does not occur.

In this case, when a flat plane which is perpendicular to the irradiated surface and which is one of the plane containing short side or the long side of a rectangle which is assumed to be a shape of the long beam is defined as incident surface, it is desired that the incident angle θ of the laser beam satisfies θ≥ arctan (W/2d) where W is a length of the short side or the long side contained in the incident surface, and the thickness of the substrate having transparency with respect to the laser beam is d. This W is W=(W$_1$+W$_2$)/2 when W$_1$ is a beam length 15 of a laser beam incident on the irradiated surface, and W$_2$ is a beam length of a laser beam reflected from a back surface of the substrate 10. It is to be noted that when the locus of the laser beam is not present on the incident surface, an incident angle of a projected one of the locus on the incident surface is defined as θ. If the laser beam is incident at the incident angle θ, the reflected beam on the surface of the substrate is not interfered with the reflected beam from the back surface of the substrate to enable the irradiation of the laser beam to be conducted uniformly. Further, by setting the incident angle θ on the irradiated body to the Brewster's angle, the reflectivity is minimized to enable the laser beam to be used effectively. In the above, refractive index of the substrate is 1. In practice, the refractive index of many substrates is about 1.5. When this value is taken into consideration, a calculation value larger than the angle calculated in the above is obtained. However, because energies of both sides of the lengthwise direction of the linear beam are attenuated, interference influence is small in this part and sufficient interference attenuation effect is obtained with the above calculated value.

Moreover, the reflection prevention film may be formed on the surface of the irradiated body.

When the annealing of the semiconductor film is performed using such a laser irradiation device, the relevant semiconductor film can be crystallized, the crystalline semiconductor can be obtained by enhancing the crystallinity and the activation of the impurity elements can be carried out.

It should be noted that the shapes of the laser beams are different depending on the kinds of the laser beams emitted from the lasers, even if the laser beam is formed by the optical system, it is susceptible to and easily influenced with the original shape. For example, the shape of the laser beam emitted from a XeCl excimer laser is in a rectangular shape, as for the shape of the laser beam emitted from the solid state laser, if the rod shape is in a cylinder shape, it becomes a circular shape, and if it is in a slab shape, it becomes a rectangular shape. The present invention can be applied to any shape.

The present invention comprising the configurations described above will be described further in detail by Embodiments indicated below.

EMBODIMENTS

Embodiment 1

Figure 3:
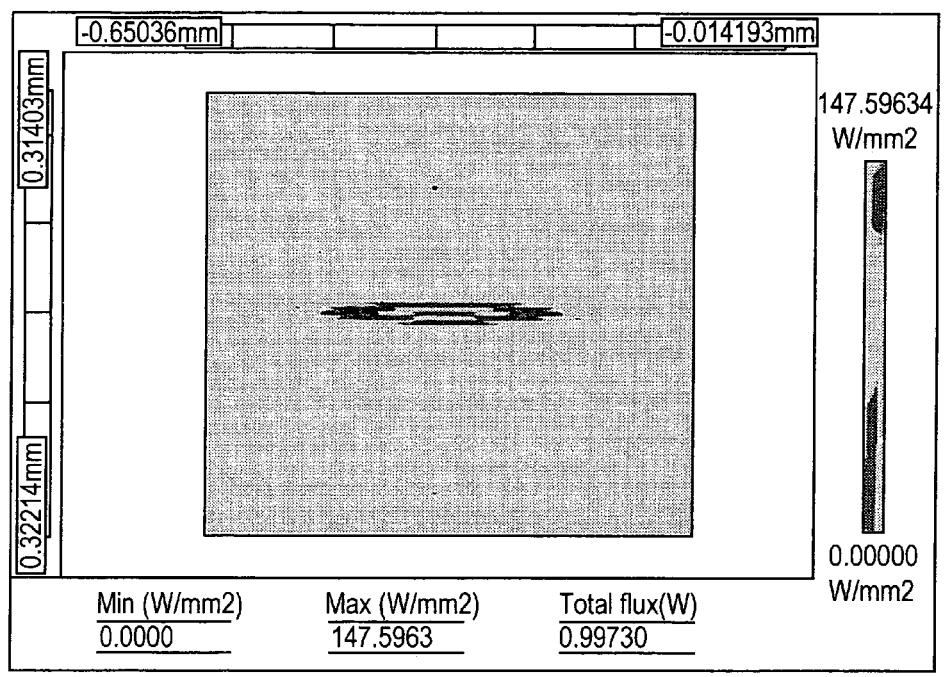
FIG. 3 is a diagram showing an example of a shape of a laser beam formed on an irradiation surface according to the present invention.

In the present Embodiment, an example in which a linear beam is formed by the present invention will be described below with reference to FIG. 1 and FIG. 3.

As the laser 101, YAG laser is used. Supposing that the laser beam oscillated from the laser 101 is converted to the second higher harmonic wave by a non-linear optical element contained in the laser 101. At this time, supposing that the laser beam is in TEMoo mode, and has 2.25 mm of beam diameter and 0.35 mrad of spreading angle.

Subsequently, the beam is incident with respect to the convex lens 103 having a focal length of 20 mm at the incident angle φ of 20 degrees. Then, in the present Embodiment, the simulation is performed on the shape of the laser beam formed on the irradiation surface disposed in parallel with the convex lens. The results of these are shown in FIG. 3. From FIG. 3, it is understood that a linear beam having a length of 420 μm and a width of 40 μm is formed on the irradiation surface. Moreover, the distribution of the energy density of the linear beam is a Gaussian distribution.

From the results of this simulation, it can be confirmed that a linear beam is formed on the irradiation surface or in its neighborhood according to the present invention. Then, when the annealing of a semiconductor film is performed using such a laser irradiation device, the relevant semiconductor film can be crystallized, a crystalline semiconductor film can be obtained by enhancing the crystallinity, and the activation of the impurity can be carried out.

Embodiment 2

Figure 4:
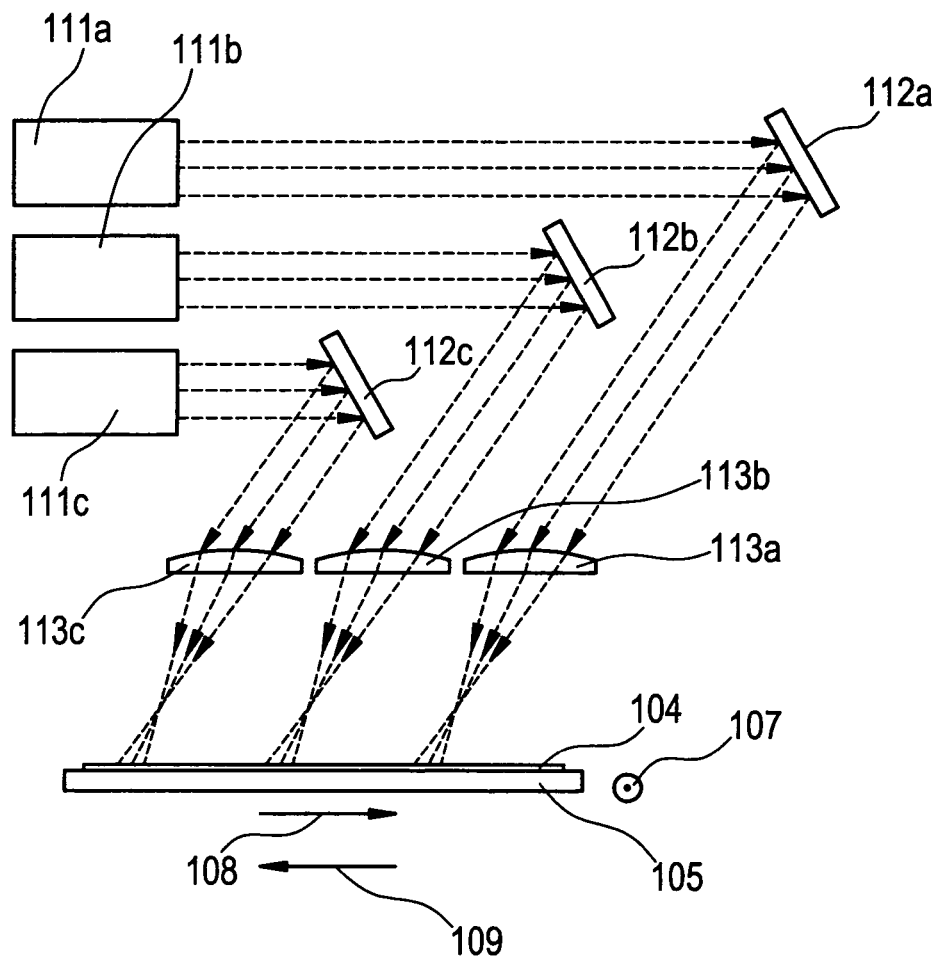
FIG. 4 is a diagram showing an example of an optical system of the present invention in the case a plurality of laser beams is used.

In the present Embodiment, an example in which the irradiation of the laser beam is performed using a plurality of laser beams will be described below with reference to FIG. 4. As lasers 111a-111c, YAG lasers are used, these are converted into the second higher harmonic wave by a non-linear optical element. Then, after the respective laser beams emitted from the lasers 111a-111c travel via mirrors 112a-112c, these are slantly incident with respect to the convex lenses 113a-113c. By slantly being incident, the focal position is shifted by an aberration such as astigmatism or the like, a linear beam can be formed on the irradiation surface or in its neighborhood. Moreover, it is desirable that an aspherical lens is used for the convex lens. It should be noted that a beam expander between the lasers 111a-111c and the mirrors 112a-112c or between the mirrors 112a-112c and the convex lenses 113a-113c is set and may be expanded into the desired sizes in both of longer direction and shorter direction, respectively. Moreover, the mirror may not be set, or a plurality of the mirrors may be set.

Then, while the linear beam formed in this way irradiates, it can irradiate the desired region or whole area on the irradiated body 104 by being relatively moved with respect to the irradiated body 104, for example, in the direction indicated with the reference numeral 107 or the directions indicated with the reference numerals 108, 109.

Since in the present invention, the optical system for forming the linear beam has a very simple configuration, it is easy to make a plurality of laser beams linear beams having the same shape on the irradiation surface. Therefore, since the same annealing is carried out on any irradiation surface where any linear beam irradiates, the whole surface of the irradiated body reaches to have a uniform physical property and the throughput is enhanced.

It should be noted that in the present invention, although an example in which three beams of lasers are used is exemplified, the number of lasers is not limited to this, and the same kind of laser may be not used. For example, it is also possible that a plurality of different lasers are employed, the desired region is irradiated by the desired laser, semiconductor films having different physical properties are formed and TFTs having different properties are prepared on the same substrate.

Embodiment 3

Figure 5:
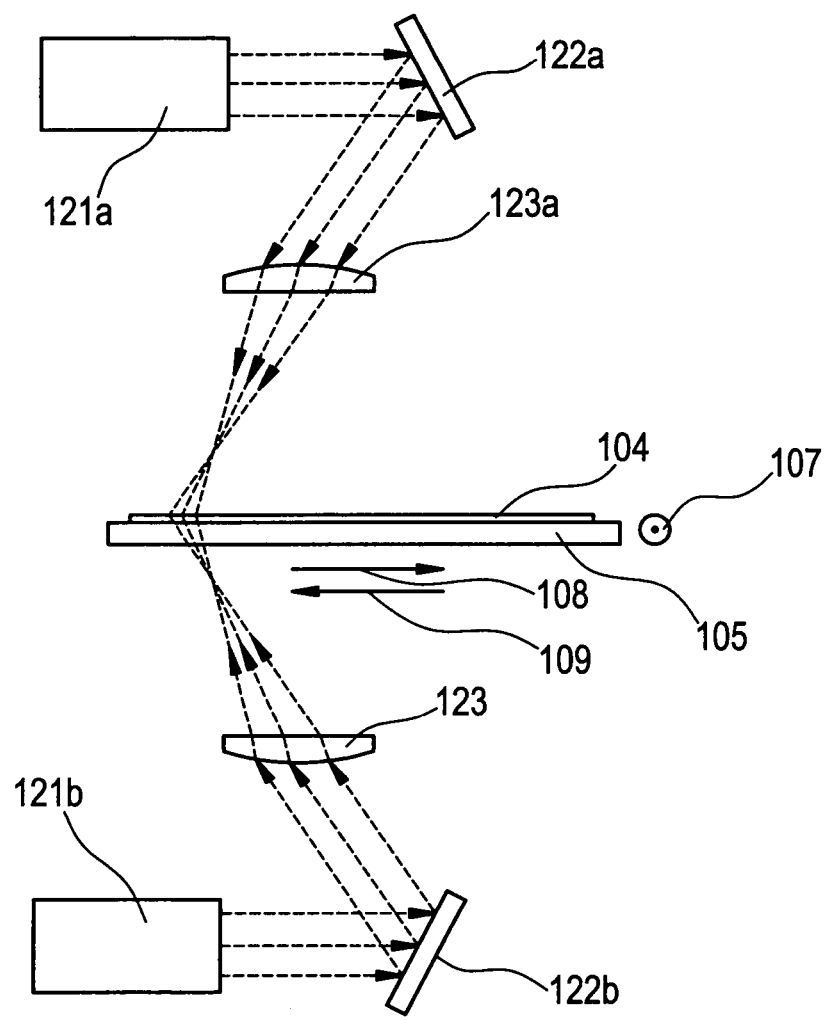
FIG. 5 is a diagram showing an example of an optical system of the present invention in the case a plurality of laser beams is used.

In the present Embodiment, an example in which the irradiation of the laser beams are carried out from both sides of the irradiated body using a plurality of lasers will be described below with reference to FIG. 5.

As lasers 121a, 121b, YVO$_4$ lasers of continuous oscillation are used, these are converted into the second higher harmonic wave by utilizing a non-linear optical element. Then, after the respective laser beams emitted from the lasers 121a, 121b travel via mirrors 122a, 122b, these are slantly incident with respect to the convex lenses 123a, 123b. By slantly being incident, the focal position is shifted by an aberration such as astigmatism or the like, a linear beam can be formed on the irradiation surface or in its neighborhood. Moreover, it is desirable that an aspherical lens is used for the convex lens.

It should be noted that a beam expander between the lasers 121a, 121b and the mirrors 122a, 122b or between the mirrors 122a, 122b and the convex lenses 123a, 123b is set and may be expanded into the desired sizes in both of longer direction and shorter direction, respectively. Moreover, the mirror may not be set, or a plurality of the mirrors may be set.

Then, while the linear beam formed in this way irradiates, it can irradiate the desired region or whole area on the irradiated body 104 by being relatively moved with respect to the irradiated body 104, for example, in the direction indicated with the reference numeral 107 or the directions indicated with the reference numerals 108, 109.

Since in the present invention, the optical system for forming the linear beam has a very simple configuration, it is easy to make a plurality of laser beams linear beams having the same shape on the irradiation surface. Therefore, a plurality of linear beams can be easily superimposed each other. Even in the case where a laser having a lower output is used depending on the irradiated body, it can be sufficiently applied according to the present Embodiment.

It should be noted that in the present invention, although an example in which two beams of lasers are used is exemplified, the number of lasers is not limited to this, and the different kinds of lasers may be used.

Moreover, it is capable of being carried out that the present Embodiment is combined with Embodiment 2.

Embodiment 4

Figure 6:
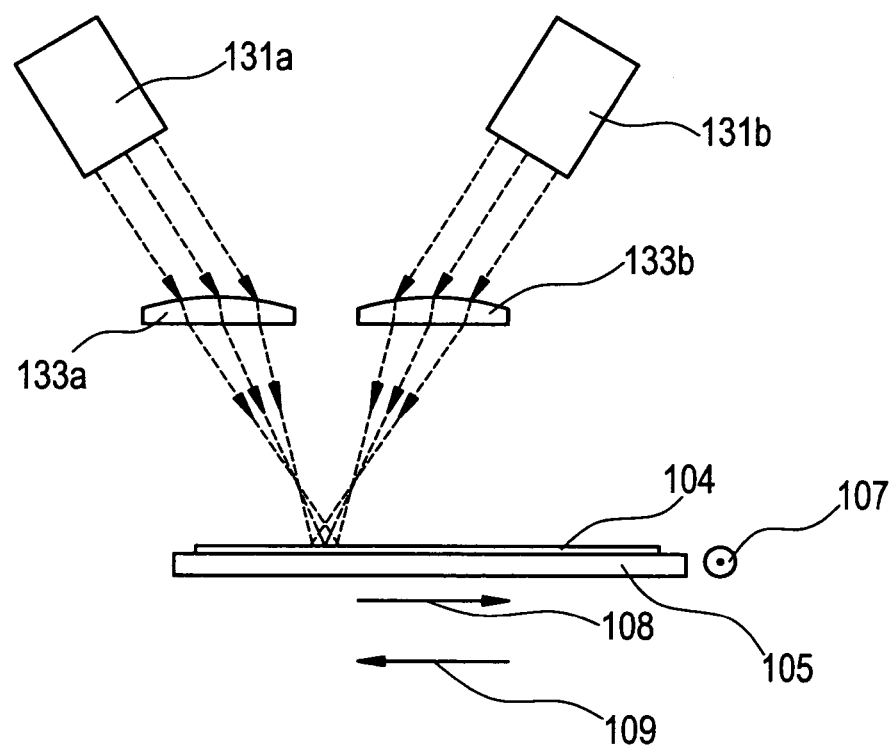
FIG. 6 is a diagram showing an example of an optical system of the present invention in the case a plurality of laser beams is used.

In the present Embodiment, an example in which the irradiation of the laser beams is carried out by utilizing a plurality of lasers and superimposing these on the surface of the irradiated body will be described below with reference to FIG. 6.

As lasers 131a, 131b, YLF lasers of continuous oscillation are used, these are converted into the third higher harmonic wave by utilizing a non-linear optical element. Then, after the respective laser beams emitted from the lasers 131a, 131b are slantly incident with respect to the convex lenses 133a, 133b. By slantly being incident, the focal position is shifted by an aberration such as astigmatism or the like, a linear beam can be formed on the irradiation surface or in its neighborhood. Moreover, it is desirable that an aspherical lens is used for the convex lens.

It should be noted that beam expanders between the lasers 131a, 131b and the convex lenses 133a, 133b are set and may be expanded into the desired sizes in both of longer direction and shorter direction, respectively. Moreover, the mirror may not be set, or a plurality of the mirrors may be set.

Then, while the linear beam formed in this way irradiates, it can irradiate the desired region or whole area on the irradiated body 104 by being relatively moved with respect to the irradiated body 104, for example, in the direction indicated with the reference numeral 107 or the directions indicated with the reference numerals 108, 109.

Since in the present invention, the optical system for forming the linear beam has a very simple configuration, it is easy to make a plurality of laser beams linear beams having the same shape on the irradiation surface. Therefore, a plurality of linear beams can be easily superimposed each other. Even in the case where a laser having a lower output is used depending on the irradiated body, it is capable of being sufficiently applied according to the present Embodiment.

It should be noted that in the present invention, although an example in which two beams of lasers are used is exemplified, the number of lasers is not limited to this, and the different kinds of lasers may be used. Moreover, although laser beams are synthesized on the irradiation surface, after being synthesized, a linear beam may be formed by an optical system.

Moreover, it is possible that the present Embodiment is freely combined with Embodiment 2 or Embodiment 3.

Embodiment 5

A method of manufacturing an active matrix substrate is explained in this embodiment using FIGS. 8 to 11. A substrate on which a CMOS circuit, a driver circuit, and a pixel portion having a TFT pixel and a holding capacity are formed together is called active matrix substrate for convenience.

First, a substrate 400 made from glass such as barium borosilicate glass or aluminum borosilicate glass is used in this embodiment. Note that substrates such as quartz substrates, silicon substrates, metallic substrates, and stainless steel substrates having an insulating film formed on the substrate surface may also be used as the substrate 400. Further, a plastic substrate having heat resisting properties capable of enduring the processing temperatures used in this embodiment may also be used. Because this invention can easily form a linear beam with a uniform energy distribution, it is possible that annealing the large area substrate is conducted effectively by using a plurality of linear beams.

Next, a base film 401 made from an insulating film such as a silicon oxide film, a silicon nitride film, or a silicon oxynitride film is then formed on the substrate 400 by the known method. A two layer structure is used as the base film 401 in this embodiment, but a single layer of the above-mentioned insulating film may also be used, and a structure in which more than two layers are laminated may also be used.

Next, semiconductor layers are formed on the base film. First of all, semiconductor film is formed with a thickness of 25 to 200 nm (preferably 30 to 150 nm) by a known method (such as the sputtering method, the LPCVD method, and the plasma CVD method). Then, the semiconductor film is crystallized by a laser crystallization method. As the laser crystallization method, the laser beam irradiates to the semiconductor film by applying one of Embodiments 1 to 4 or by freely combining any one of Embodiments 1 to 4. It is preferable that a solid-state laser of continuous oscillation or pulse oscillation, a gas laser, or metallic laser is used. Note that, as the solid-state laser, there may be given a YAG laser, a $YVO_4$ laser, a YLF laser, a $YAlO_3$ laser, a glass laser, a ruby laser, an alexandrite laser, a Ti:sapphire laser, and the like. As a the gas laser, there may be given a excimer laser of continuous oscillation or pulse oscillation, Ar laser, Kr laser, $CO_2$ laser, or the like. And as the metallic laser, there may be given a helium cadmium laser, a copper vapor laser, or a gold vapor laser. Of course, not only the laser crystallization method but also any other known crystallization method (RTA, the thermal crystallization method using a furnace annealing, the thermal crystallization method using metallic elements which promote crystallization) may also be combined. The semiconductor film may be an amorphous semiconductor film, a microcrystal semiconductor film or a crystalline semiconductor film. Alternatively, the semiconductor film may be a compound semiconductor film having an amorphous structure such as an amorphous silicon germanium film.

In this embodiment, plasma CVD method is used to form an amorphous silicon film with a thickness of 50 nm, and then the thermal crystallization method using metallic elements, which promote crystallization, and laser crystallization method are used for the amorphous silicon film. Nickel is used as a metal element, and is introduced onto the amorphous silicon film by a solution coating method. Then heat treatment is conducted at 500° C. for five hour, whereby obtaining a first crystalline silicon film. Subsequently, the laser beam shot from a continuous oscillation $YVO_4$ laser with output 10 W is converted into the second higher harmonic wave by a nonlinear optical element and then a linear laser beam is formed and irradiated by one of the optical system shown in Embodiments 1 thorough 4 or by the optical system combined these embodiments, whereby obtaining a second crystalline silicon film. Irradiating the laser beam to the first crystalline silicon film, and changing the first crystalline silicon film to the second crystalline silicon film improve the crystallinity of the second crystalline silicon film. At this moment, about 0.01 to 100 $MW/cm^2$ (preferably 0.1 to 10 $MW/cm^2$) is necessary for the energy density. The stage is relatively moved to the laser beam at a speed of about 0.5 to 2000 cm/s, and it irradiates, and then the crystalline silicon film is formed. When the excimer laser of pulse oscillation is used, it is preferable that 300 Hz of frequency and 100 to 1000 $mj/cm^2$ (typically, 200 to 800 $mj/cm^2$) of laser energy density are used. At this moment, laser beam may be overlapped by 50 to 98%.

Of course, although a TFT can be formed by using the first crystalline silicon film, it is preferable that the second crystalline silicon film is used to form the TFT since the second crystalline silicon film has an improved crystallinity and electric characteristics of TFT are improved. For instance, although, when TFT is formed by using the first crystalline silicon film, a mobility is almost 300 $cm^2/Vs$, when TFT is formed by using the second crystalline silicon film, the mobility is extremely improved with about 500 to 600 $cm^2/Vs$.

The semiconductor layers 402 to 406 are formed by performing patterning processing on thus obtained semiconductor film by using the photolithography method.

Doping of a very small amount of an impurity element (boron or phosphorous) may be performed after forming the semiconductor layers 402 to 406 in order to control a TFT threshold value.

A gate insulating film 407 is formed next, covering the semiconductor layers 402 to 406. The gate insulating film 407 is formed by an insulating film containing silicon with a thickness of 40 to 150 nm, using plasma CVD or sputtering. In this embodiment, a silicon oxynitride film having a film thickness of 110 nm is formed by plasma CVD method. The gate insulating film is of course not limited to a silicon oxynitride film, and other insulating films containing silicon may be used in a single layer or in a lamination structure.

Further, if a silicon oxide film is used, it can be formed by plasma CVD method with a mixture of TEOS (Tetraethyl Orthosilicate) and $O_2$, at a reaction pressure of 40 Pa, with the substrate temperature set from 300 to 400° C., and by discharging at a high frequency (13.56 MHz) electric power density of 0.5 to 0.8 W/cm². Good characteristics as a gate insulating film can be obtained by subsequently performing thermal annealing, at between 400 and 500° C., of the silicon oxide film thus manufactured.

A first conductive film 408 having a film thickness of 20 to 100 nm, and a second conductive film 409 having a film thickness of 100 to 400 nm are then formed and laminated on the gate insulating film 407. The first conductive film 408, made from a TaN film having a film thickness of 30 nm, and the second conductive film 409, made from a W film having a film thickness of 370 nm, are formed and laminated in this embodiment. The TaN film is formed by sputtering, and sputtering of a Ta target is performed in a nitrogen atmosphere. Further, the W film is formed by sputtering using a W target. In addition, the W film can also be formed by thermal CVD method using tungsten hexafluoride ($WF_6$). Whichever is used, it is necessary to be able to make the film become low resistance in order to use it as a gate electrode, and it is preferable that the resistivity of the W film be made less than 20 μΩcm.

Note that although the first conductive film 408 is TaN and the second conductive film 409 is W in this embodiment, there are no particular limitations placed on the conductive films. The first conductive film 408 and the second conductive film 409 may also be formed from an element selected from the group consisting of Ta, W, Ti, Mo, Al, Cu, Cr, and Nd, or from an alloy material having one of these elements as its main constituent, or from a chemical compound of these elements. Further, a semiconductor film, typically a polycrystalline crystalline silicon film, into which an impurity element such as phosphorous is doped may also be used, as may an AgPdCu alloy.

Masks 410 to 415 are formed next from resist using a photolithography method, and a first etching process is performed in order to form electrodes and wirings. The first etching processing is performed in accordance with first and second etching conditions (FIG. 8B). An ICP (Inductively Coupled Plasma) etching method is used as a first etching condition in this embodiment. A gas mixture of $CF_4$, $Cl_2$, and $O_2$ is used as an etching gas, the gas flow rates are set to 25:25:10 (sccm), respectively, a plasma is generated by supplying a 500 W RF (13.56 MHz) electric power to a coil shape electrode at a pressure of 1 Pa, and etching is performed. A 150 W RF (13.56 MHz) electric power is also applied to the substrate side (sample stage), thereby applying a substantially negative self-bias voltage. The W film is etched under the first etching conditions, and the edge portion of the first conductive layer is made into a tapered shape.

The etching conditions are changed to a second etching condition without removing the masks 410 to 415 made of resist. A gas mixture of $CF_4$ and $Cl_2$ is used as an etching gas, the gas flow rates are set to 30:30 (sccm), respectively, a plasma is generated by applying a 500 W RF (13.56 MHz) electric power to a coil shape electrode at a pressure of 1 Pa, and etching is performed for approximately 30 seconds. A 20 W RF (13.56 MHz) electric power is also supplied to the substrate side (sample stage), thereby applying a substantially negative self-bias voltage. The W film and the TaN film are both etched by on the same order by the second etching conditions using the gas mixture of $CF_4$ and $Cl_2$. Note that the etching time may be increased on the order of 10 to 20% in order to perform etching such that no residue remains on the gate insulating film.

Edge portions of the first conductive layer and the second conductive layer are made into a tapered shape in accordance with the effect of a bias voltage, applied to the substrate side, by making the shapes of the resist masks suitable with the above-mentioned first etching condition. The angle of the tapered portions is from 15 to 45°. First shape conductive layers 417 to 422 (first conductive layers 417a to 422a, and second conductive layers 417b to 422b) are thus formed from the first conductive layers and the second conductive layers by the first etching process. Reference numeral 416 denotes a gate insulating film, and regions not covered by the first shape conductive layers 417 to 422 become thinner by approximately 20 to 50 nm, through etching.

A second etching process is then performed without removing the masks made of resist (FIG. 8C). Here, W film is selectively etched by using $CF_4$, $Cl_2$, and $O_2$ for the etching gas. At this time, the second conductive layers 428b to 433b are formed by the second etching process. On the other hand, the first conductive layers 417a to 422a are hardly etched and the second shape conductive layers 428 to 433 are formed.

A first doping process is then performed without removing the masks made of resist and the semiconductor layer is added to the impurity element which imparts n-type at a low concentration. The doping process may be performed by ion doping method or ion injection method. Ion doping is performed with process conditions in which the dosage is set from $1\times10^{13}$ to $5\times10^{14}$/cm², and the acceleration voltage is set between 40 to 80 keV. Doping is performed in this embodiment with the dosage set to $1.5\times10^{13}$/cm², and the acceleration voltage set to 60 keV. An element belonging to the group 15, typically phosphorous (P) or arsenic (As) is used as an impurity element which imparts n-type. Phosphorous (P) is used here. In this case the conductive layers 428 to 433 act as masks with respect to the impurity element which imparts n-type conductivity, and the impurity regions 423 to 427 are formed in a self-aligning manner. The impurity element which imparts n-type is added to the impurity regions 423 to 427 at a concentration in a range of $1\times10^{18}$ to $1\times10^{20}$/cm³.

Next, after removing the masks made of resist, new masks 434a to 434c made of resist are formed, and the second doping process is performed in higher acceleration voltage than the first doping process. Ion doping is performed with process conditions in which the dosage is set from $1\times10^{13}$ to $1\times10^{15}$/cm², and the acceleration voltage is set between 60 to 120 keV. The doping process is performed by using the second conductive layers 428b to 432b as masks and the semiconductor layer under the tapered portion of the first conductive layer is added to the impurity element. Continuously the acceleration voltage is lowered than the second doping process, the third doping process is done, and the state of FIG. 9A is obtained. Ion doping method is performed with process conditions in which the dosage is set from $1\times10^{15}$ to $1\times10^{17}$/cm², and the acceleration voltage is set between 50 to 100 keV. Low concentration impurity regions 436, 442 and 448 overlapping with the first conductive layer are added to the impurity element, which imparts n-type within the range of the density of $1\times10^{18}$ to $5\times10^{19}$/cm² by the second doping process and the third doping process and high concentration impurity regions 435, 441, 444 and 447 are added to the impurity element, which imparts n-type within the range of the density of $1\times10^{19}$ to $5\times10^{21}$/cm$^2$.

Of course, the second doping process and the third doping process can be one-time doping processes by making it to a suitable acceleration voltage and it is also possible to form the low concentration impurity region and high concentration impurity region.

Next, after removing the masks made of resist, new masks 450a to 450c made from resist are formed and the fourth doping process is performed. Impurity regions 453, 454, 459 and 460, to which an impurity element which imparting a conductivity type opposite to that of the above one conductivity type is added, are formed in accordance with the fourth doping process in the semiconductor films which become active layers of the p-channel type TFTs. The second conductive layers 429b to 432b are used as masks with respect to the impurity element, and an impurity element which imparts p-type conductivity is added to form the impurity regions in a self-aligning manner. The impurity regions 453, 454, 459 and 460 are formed by ion doping method using diborane ($B_2H_6$) in this embodiment (FIG. 9B). The semiconductor layers for forming the n-channel type TFT are covered with the masks 450a to 450c made of resist when the fourth doping process is performed. Phosphorous is added at different concentrations into the impurity regions 439 and 447 by the first to third doping processes. However, by performing doping such that the concentration of the impurity element which imparts p-type conductivity becomes from $1\times10^{19}$ to $5\times10^{21}$ atoms/cm$^3$ in the respective regions, no problems develop in making the regions function as source regions and drain regions of the p-channel type TFT.

The impurity regions are thus formed in the respective semiconductor layers by the steps up through this point.

A first interlayer insulating film 461 is formed next after removing the masks 450a to 450c made of resist. This first interlayer insulating film 461 is formed from an insulating film containing silicon, having a thickness of 100 to 200 nm, by using plasma CVD method or sputtering method. A silicon oxynitride film having a thickness of 150 nm, is formed by plasma CVD method in this embodiment. The first interlayer insulating film 461 is of course not limited to a silicon oxynitride film, and other insulating films containing silicon may also be used, as a single layer or a lamination structure.

Subsequently, a recovery of the crystallinity of the semiconductor layer and an activation of the impurity elements added to the respective semiconductor layers are performed by irradiating the laser beam, as shown in FIG. 9C. As the laser activation, the laser beam irradiates to the semiconductor film by applying one of Embodiments 1 to 4 or by freely combining with these embodiments. It is preferable that a solid-state laser of a continuous oscillation or a pulse oscillation, a gas laser, or metallic laser is used. Note that, as the solid-state laser, there may be given a YAG laser of a continuous oscillation or a pulse oscillation, a $YVO_4$ laser, a YLF laser, a $YAlO_3$ laser, a glass laser, a ruby laser, an alexandrite laser, a Ti: sapphire laser, and the like. As a the gas laser, there may be given a excimer laser of continuous oscillation or pulse oscillation, Ar laser, Kr laser, $CO_2$ laser, or the like. And as the metallic laser, there may be given a helium cadmium laser, a copper vapor laser, or a gold vapor laser. At this moment, if a continuous oscillation laser is used, about 0.01 to 100 MW/cm$^2$ (preferably 0.1 to 10 MW/cm$^2$) is necessary for the energy density of laser beam. The substrate is relatively moved to the laser beam at a speed of about 0.5 to 2000 cm/s. And, if a pulse oscillation laser is used, it is preferable that 300 Hz of frequency and 50 to 100 mj/cm$^2$ (typically, 50 to 500 mj/cm$^2$) of laser energy density are used. At this moment, laser beam may be overlapped by 50 to 98%. Besides laser annealing method, thermal annealing method or rapid thermal annealing method (RTA method) and the like can be applied.

Further, the activation may also be performed before the formation of a first interlayer insulating film. However, if the wiring material used is weak with respect to heat, then it is preferable to perform the activation processing after forming an interlayer insulating film (an insulating film having silicon as its main constituent, for example a silicon nitride film) in order to protect the wirings and the like, as in this embodiment.

Then, a heat treatment can also be performed (at 300 to 550° C. for 1 to 12 hours) and it is possible to conduct a hydrogenation. This process is one of terminating dangling bonds in the semiconductor layers by hydrogen contained within the first interlayer insulating film 461. The semiconductor layers can be hydrogenated whether or not the first interlayer insulating film exists. Plasma hydrogenation (using hydrogen excited by a plasma), and a heat treatment for 1 to 12 hours at a temperature of 300 to 450° C. in an atmosphere containing hydrogen of from 3 to 100% may also be performed as other means of hydrogenation.

Subsequently, a second interlayer insulating film 462 made from an inorganic insulating film material or from an organic insulating material is formed on the first interlayer insulating film 461. An acrylic resin film having a film thickness of 1.6 µm is formed in this embodiment, and the material used may have a viscosity from 10 to 1000 cp, preferably between 40 to 200 cp. A material in which unevenness is formed on its surface is used.

In order to prevent mirror reflection, the surface of a pixel electrode is made uneven by forming a second interlayer insulating film which forms an uneven surface in this embodiment. Further, the pixel electrode surface can be made to be uneven and have light scattering characteristics, and therefore a convex portion may also be formed in a region below the pixel electrode. The formation of the convex portion can be performed by the same photomask as that for forming the TFTs, and therefore it can be formed without increasing the number of process steps. Note that the convex portion may also be formed appropriately on the substrate of the pixel portion region except the wirings and TFTs. In this way, unevenness is formed in the surface of the pixel electrode along the unevenness formed in the surface of the insulating film which covers the convex portion.

A film having a level surface may also be used as the second interlayer insulating film 462. In this case, it is preferable that the surface be made uneven by an added process such as a known sandblasting process or etching process to prevent mirror reflection, and thereby increasing whiteness by scattering reflected light.

Wirings 463 to 467 for electrically connecting respective impurity regions are then formed in a driver circuit 506. Note that a lamination film of a Ti film having a thickness of 50 nm, and an alloy film (an alloy of Al and Ti) having a thickness of 500 nm is patterned in order to form the wirings. Of course, it is not limited to the two-layer structure, the single-layer structure or the lamination structure more than three layers may also be acceptable. Further, Al and Ti are not limited to the wiring material. For example, Al and Cu are formed on TaN film, and the lamination film forming the Ti film is formed by the patterning and form wiring (FIG. 10).

Further, a pixel electrode 470, a gate wiring 469, and a connection electrode 468 are formed in a pixel portion 507. An electrical connection is formed with the pixel TFT and the source wiring by the connection electrode 468. Further, the gate wiring 469 forms an electrical connection with the gate electrode of the pixel TFT. The pixel electrode 470 forms an electrical connection with the drain region 444 of the pixel TFT, and in addition, forms an electrical connection with the semiconductor layer 459 which functions as one electrode forming a storage capacitor. It is preferable to use a material having superior reflectivity, such as a film having Al or Ag as its main constituent, or a lamination film of such films, as the pixel electrode 470.

A CMOS circuit composed of a n-channel TFT 501 and a p-channel TFT 502, a driver circuit 506 having an n-channel TFT 503, and the pixel portion 507 having a pixel TFT 504 and a storage capacitor 505 can thus be formed on the same substrate. The active matrix substrate is thus completed.

The n-channel TFT 501 of the driver circuit 506 has: a channel forming region 437; the low concentration impurity region 436 (GOLD region) which overlaps with the first conductive layer 428*a* that structures a portion of the gate electrode; and the high concentration impurity region 452 which functions as a source region or a drain region. The p-channel TFT 502, which forms the CMOS circuit with the n-channel TFT 501 and the electrode 466 by an electrical connection has: a channel forming region 455; the low concentration impurity region 454; and the impurity region 453 in which the impurity elements imparting n-type and p-type are introduced. Further, the n-channel TFT 503 has: a channel forming region 443; the low concentration impurity region 442 (GOLD region) which overlaps with the first conductive layer 430*a* that structures a portion of the gate electrode; and the high concentration impurity region 441 which functions as a source region or a drain region.

The pixel TFT 504 of the pixel portion has: a channel forming region 446; the low concentration impurity region 445 (LDD region) formed on the outside of the gate electrode; and the high concentration impurity region 458 which functions as a source region or a drain region. Further, an impurity element which imparts n-type and an impurity element which imparts p-type are added to the semiconductor layer which functions as one electrode of the storage capacitor 505. The storage capacitor 505 comprises an electrode (lamination of 432*a* and 432*b*) and the semiconductor layer, with the insulating film 416 functioning as a dielectric.

Edge portions of the pixel electrodes are disposed so as to overlap with source wirings such that gaps between the pixel electrodes shield the light, without using a black matrix, with the pixel structure of this embodiment.

Figure 11:
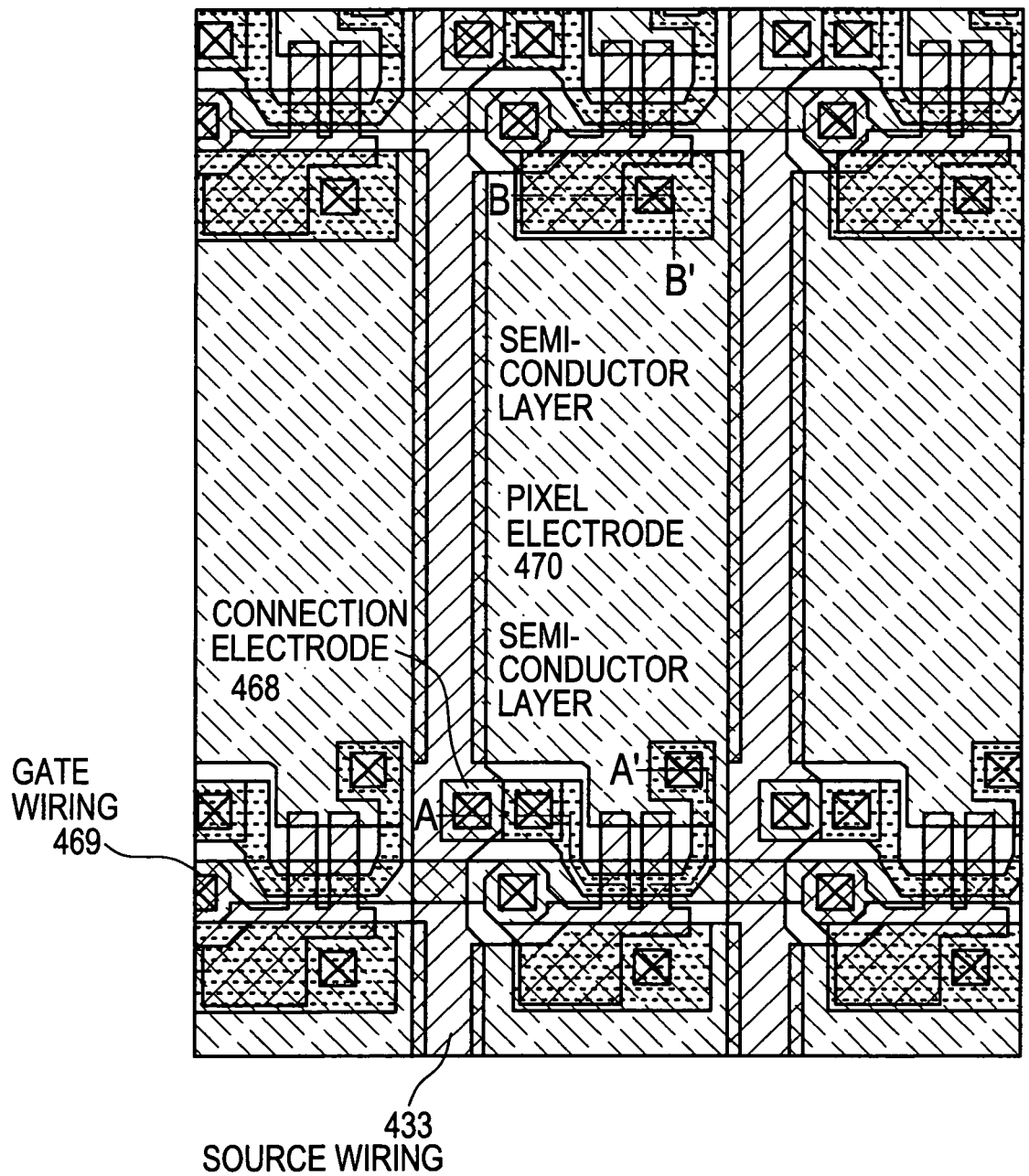
FIG. 11 is a top view for explaining a structure of a pixel TFT.

An upper surface diagram of the pixel portion of the active matrix substrate manufactured in this embodiment is shown in FIG. 11. Note that the same reference symbols are used for portions corresponding to those in FIGS. 8 to 11. A chain line A-A' in FIG. 10 corresponds to a cross sectional diagram cut along a chain line A-A' within FIG. 11. Further, a chain line B-B' in FIG. 10 corresponds to a cross sectional diagram cut along a chain line B-B' within FIG. 11.

Embodiment 6

Figure 12:
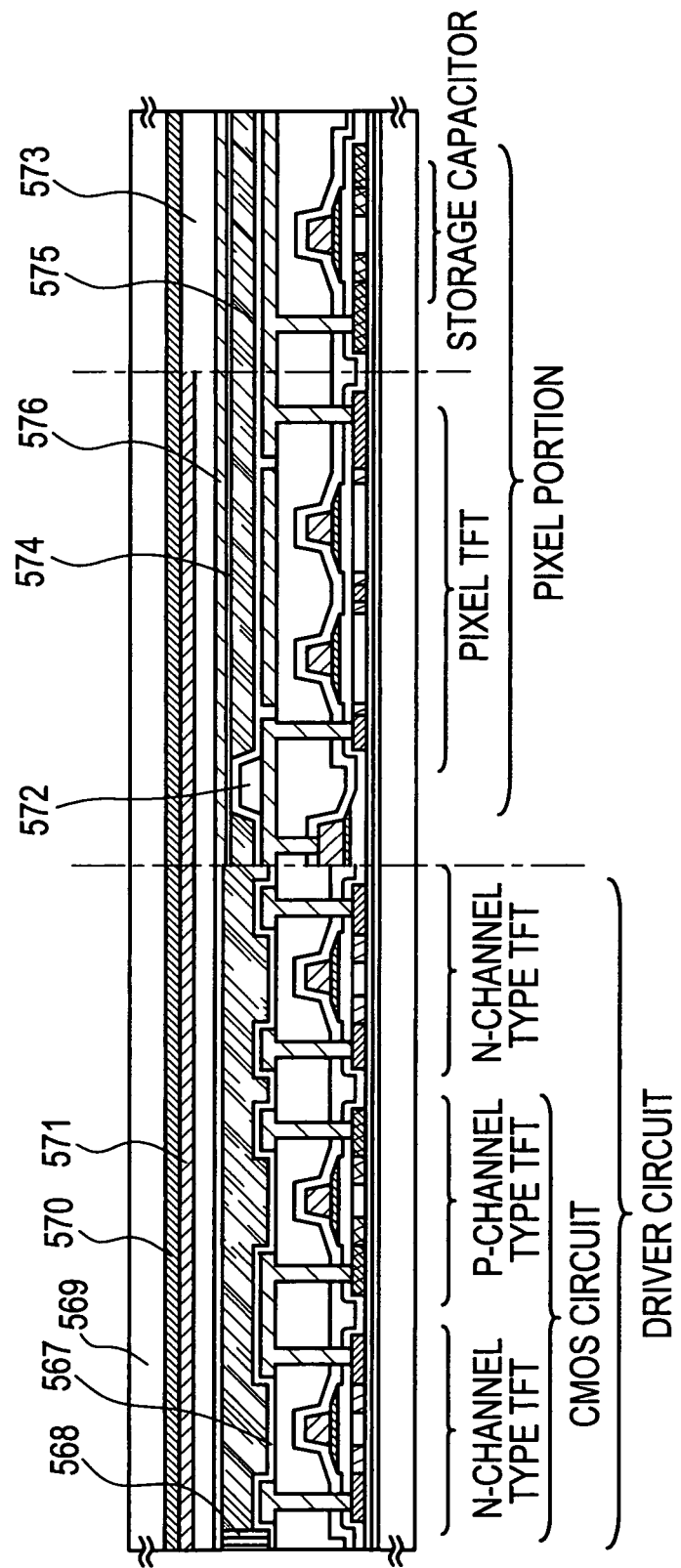
FIG. 12 is a cross sectional view of an active matrix type liquid crystal display device.

A process of manufacturing a reflection type liquid crystal display device from the active matrix substrate manufactured in Embodiment 5 is explained below in this embodiment. FIG. 12 is used in the explanation.

An active matrix substrate in the state of FIG. 10 is first obtained in accordance with Embodiment 5, an orientation film 567 is then formed on at least the pixel electrode 470 on the active matrix substrate of FIG. 10, and a rubbing process is performed. Note that, before forming the orientation film 567 in this embodiment, columnar spacer 572 is formed in desired positions by patterning an organic resin film, such as an acrylic resin film and the like, in order to maintain a gap between substrates. Further, spherical spacers may also be distributed over the entire surface of the substrate as a substitute for the columnar spacers.

An opposing substrate 569 is prepared next. Coloring layers 570 and 571, and a leveling film 573 are then formed on the opposing substrate 569. The red coloring layer 570 and a blue coloring layer 571 are overlapped to form a light shielding portion. Furthermore, the light shielding portion may also be formed by overlapping a portion of the red coloring layer with a green coloring layer.

The substrate shown in Embodiment 5 is used in this embodiment. Therefore, with the top view of the pixel portion of Embodiment 5 shown in FIG. 11, it is necessary that, at least, the gap between the gate wiring 469 and the pixel electrode 470, the gap between the gate wiring 469 and the connection electrode 468, and the gap between the connection electrode 468 and the pixel electrode 470 be shielded from light. Each of the coloring layers are arranged such that the light shielding portions made from the lamination of the coloring layers are formed in positions that must be shielded from light, and then are joined to the opposing substrate.

It is thus made possible to reduce the number of process steps by performing light shielding of the respective gaps between the pixels by using the light shielding portions, composed of the laminations of the coloring layers, without forming a light shielding layer such as a black mask and the like.

An opposing electrode 576 made from a transparent conductive film is formed on the leveling film 573 over at least the pixel portion, an orientation film 574 is formed over the entire surface of the opposing substrate, and a rubbing process is performed.

The active matrix substrate on which the pixel portion and the driver circuit are formed, and the opposing substrate are then joined by a sealing material 568. A filler is mixed into the sealing material 568, and the two substrates are joined while maintaining a uniform gap in accordance with the filler and the columnar spacers. A liquid crystal material 575 is then injected between both substrates, and the substrates are completely sealed by using a sealant (not shown in the figure). A known liquid crystal material may be used for the liquid crystal material 575. The reflection type liquid crystal display device shown in FIG. 12 is thus completed. The active matrix substrate or the opposing substrate is then cut into a desired shape if necessary. In addition, a polarizing plate (not shown in the figure) is attached to only the opposing substrate. An FPC is then attached using a known technique.

Liquid crystal display device made by above-mentioned method has TFT manufactured by using the semiconductor film thoroughly annealed because the laser beam with a very excellent uniformity of the energy distribution is irradiated. It is possible to become the one with enough operation characteristic and reliability of the above-mentioned liquid crystal display device. Such a liquid crystal display can be used as a display portion in various kinds of electronic equipment.

Note that it is possible to freely combine this embodiment with Embodiments 1 to 5.

Embodiment 7

In this embodiment, an example of manufacturing the light emitting device by using a manufacturing method of TFT that is used for forming an active matrix substrate. In this specification, the light emitting device is the general term for the display panel enclosed a light emitting element formed on the substrate between the aforesaid substrate and the cover member, and to the aforesaid display module equipped TFT with the aforesaid display panel. Incidentally, the light emitting element has a layer including a compound in which an electroluminescence can be obtained by applying an electric field (a light emitting layer), an anode, and a cathode. Meanwhile, the electroluminescence in organic compound includes the light emission (fluorescence) upon returning from the singlet-excited state to the ground state and the light emission (phosphorescence) upon returning from the triplet-excited state to the ground state, including any or both of light emission.

In this specification, all layers formed between the anode and the cathode in the light emitting element are defined as the organic light emitting layer. The light emitting layer, the hole injection layer, the electron injection layer, the hole transportation layer, and the electron transportation layer, etc. are concretely included in the organic light emitting layer. The light emitting element basically has the structure that the anode layer, the light emitting layer, and the cathode layer are sequentially laminated. In addition to this structure, the light emitting element may also has a structure that the anode layer, the hole injection layer, the light emitting layer, and the cathode layer are sequentially laminated or a structure that the anode layer, the hole injection layer, the light emitting layer, the hole transportation layer, and the cathode layer etc. are sequentially laminated.

Figure 13:
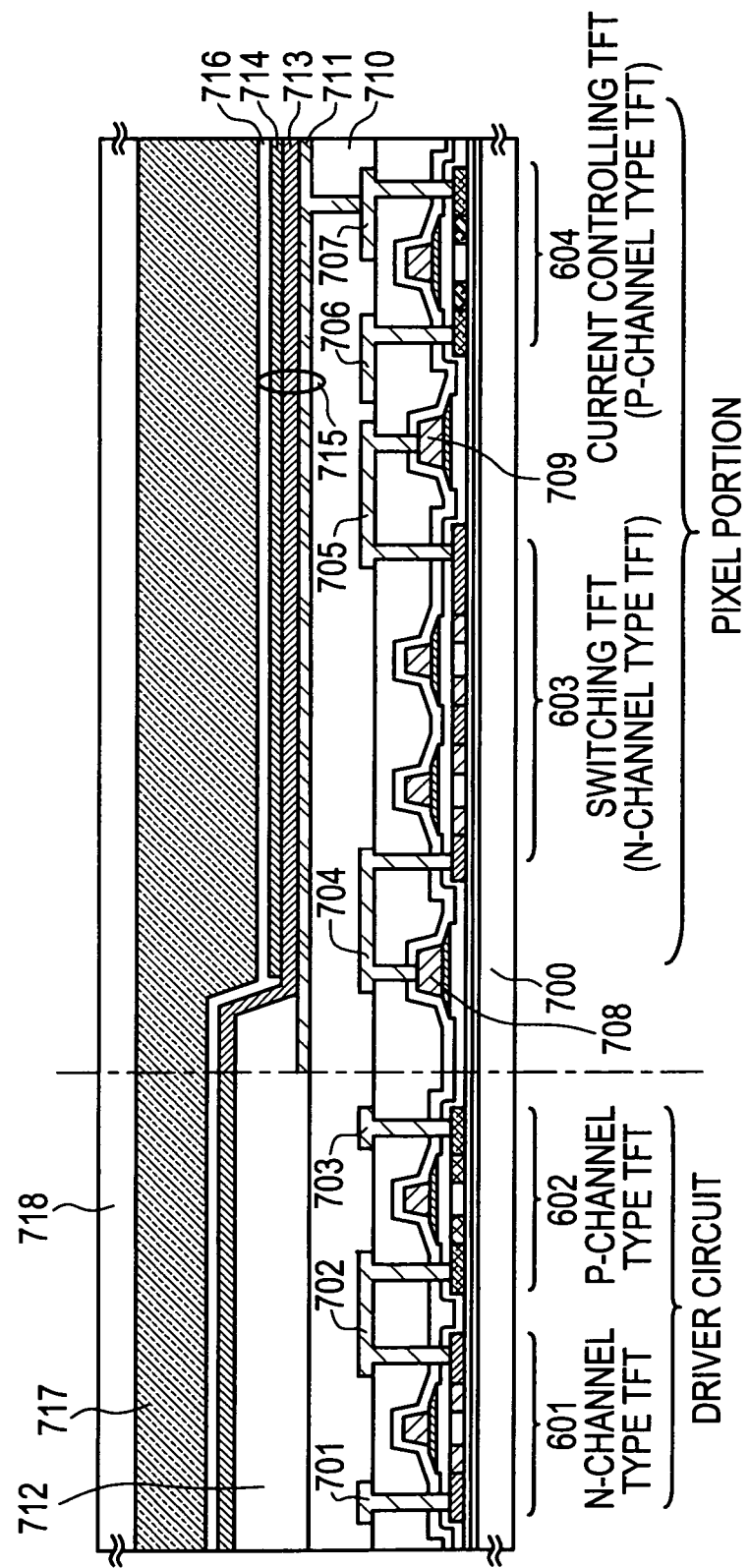
FIG. 13 is a cross sectional structure diagram of a driver circuit and pixel portion of a light emitting device.

FIG. 13 is a sectional view of a light emitting device of this embodiment. In FIG. 13, the switching TFT 603 provided on the substrate 700 is formed by using the n-channel TFT 503 of FIG. 10. Consequently, concerning the explanation of the structure, it is satisfactory to refer the explanation on the n-channel TFT 503.

Incidentally, although this example is of a double gate structure formed with two channel regions, it is possible to use a single gate structure formed with one channel region or a triple gate structure formed with three.

The driver circuit provided on the substrate 700 is formed by using the CMOS circuit of FIG. 10. Consequently, concerning the explanation of the structure, it is satisfactory to refer the explanation on the n-channel TFT 601 and p-channel TFT 602. Incidentally, although this embodiment is of a single gate structure, it is possible to use a double gate structure or a triple gate structure.

Meanwhile, the wirings 701, 703 serve as source wirings of the CMOS circuit while the wiring 702 as a drain wiring. Meanwhile, a wiring 704 serves as a wiring to electrically connect between the source wiring 708 and the source region of the switching TFT while the wiring 705 serves as a wiring to electrically connect between the drain wiring 709 and the drain region of the switching TFT.

Incidentally, a current control TFT 604 is formed by using the p-channel TFT 502 of FIG. 10. Consequently, concerning the explanation of the structure, it is satisfactory to refer to the explanation on the p-channel TFT 502. Incidentally, although this embodiment is of a single gate structure, it is possible to use a double gate structure or a triple gate structure.

Meanwhile, the wiring 706 is a source wiring of the current control TFT (corresponding to a current supply line) while the wiring 707 is an electrode to be electrically connected to the pixel electrode 711.

Meanwhile, reference numeral 711 is a pixel electrode (anode of a light-emitting element) formed by a transparent conductive film. As the transparent conductive film can be used a compound of indium oxide and tin oxide, a compound of indium oxide and zinc oxide, zinc oxide, tin oxide or indium oxide, or otherwise may be used a transparent conductive film as above added with gallium. The pixel electrode 711 is formed on a planar interlayer insulating film 710 prior to forming the wirings. In this embodiment, it is very important to planarize the step due to the TFT by using a resin planarizing film 710. A light-emitting layer to be formed later, because being extremely small in thickness, possibly causes poor light emission due to the presence of a step. Accordingly, it is desired to provide planarization prior to forming a pixel electrode so that a light-emitting layer can be formed as planar as possible.

After forming the wirings 701 to 707, a bank 712 is formed as shown in FIG. 13. The bank 712 may be formed by patterning an insulating film or organic resin film containing silicon having 100 to 400 nm.

Incidentally, because the bank 712 is an insulating film, caution must be paid to element electrostatic breakdown during deposition. In this embodiment added is a carbon particle or metal particle to an insulating film as a material for the bank 712, thereby reducing resistivity and suppressing occurrence of static electricity. In such a case, the addition amount of carbon or metal particle may be adjusted to provide a resistivity of $1 \times 10^6$ to $1 \times 10^{12}$ Ωm (preferably $1 \times 10^8$ to $1 \times 10^{10}$ Ωm).

A light emitting layer 713 is formed on the pixel electrode 711. Incidentally, although FIG. 13 shows only one pixel, this embodiment separately forms the light-emitting layer correspondingly to the respective colors of R (red), G (green) and B (blue). Meanwhile, in this embodiment is formed a low molecular weight organic light emitting material by the deposition process. Specifically, this is a lamination structure having a copper phthalocyanine (CuPc) film provided in a thickness of 20 nm as a hole injecting layer and a tris-8-qyuinolinolato aluminum complex ($Alq_3$) film provided thereon in a thickness of 70 nm as a light-emitting layer. The color of emission light can be controlled by adding a fluorescent pigment, such as quinacridone, perylene or DCM1, to $Alq_3$.

However, the foregoing example is an example of organic light emitting material to be used for a light-emitting layer and not necessarily limited to this. It is satisfactory to form a light-emitting layer (layer for light emission and carrier movement therefore) by freely combining a light-emitting layer, a charge transporting layer and an electron injecting layer. For example, although in this embodiment was shown the example in which a low molecular weight organic light emitting material is used for a light-emitting layer, it is possible to use an intermediate organic light emitting material and a high molecular weight organic light emitting material. Furthermore, an organic light-emitting material, having no sublimation property but having molecules in the number of 20 or less or chained molecules having a length of 10 μm or less, is provided as a intermediate molecular organic light emitting material. For an example of using the high molecular weight organic light emitting material, a polythiophene (PEDOT) film with a thickness of 20 nm is formed by the spin coating method as a hole injection layer and the lamination structure installing paraphenylenvinylene (PPV) of about 100 nm on it as a light emitting layer may be good. The luminescence wave length can be selected from red to blue by using the π-conjugated type polymer of PPV. Meanwhile, it is possible to use an inorganic material such as silicon carbide for an electron transporting layer or charge injecting layer. These organic light emitting materials or inorganic materials can be a known material.

Next, a cathode 714 of a conductive film is provided on the light-emitting layer 713. In this embodiment, as the conductive film is used an alloy film of aluminum and lithium. Of course, a known MgAg film (alloy film of magnesium and silver) may be used. As the cathode material may be used a conductive film of an element belonging to the periodic-table group 1 or 2, or a conductive film added with such an element.

A light-emitting element 715 is completed at a time having formed up to the cathode 714. Incidentally, the light-emitting element 715 herein refers to a diode formed with a pixel electrode (anode) 711, a light-emitting layer 713 and a cathode 714.

It is effective to provide a passivation film 716 in such a manner to completely cover the light-emitting element 715. The passivation film 716 is formed by an insulating film including a carbon film, a silicon nitride film or a silicon oxynitride film, and used is an insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range not more than 100° C. from room temperature, can be easily deposited over the light-emitting layer 713 low in heat resistance. Meanwhile, the DLC film, having a high blocking effect to oxygen, can suppress the light-emitting layer 713 from oxidizing. Consequently, the problem of oxidation can be prevented in the light-emitting layer 713 during the following sealing process.

Furthermore, a sealing member 717 is provided on the passivation film 716 so as to bond a cover member 718. For the sealing member 717 used may be an ultraviolet curable resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof. In addition to the carbon film, the aluminum film (such as AlON, AlN, and AlO), SiN and the like are used.

Thus, completed is a light emitting device having a structure as shown in FIG. 13. Incidentally, it is effective to continuously carry out, without release to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, n-channel TFTs 601 and 602, a switching TFT (n-channel TFT) 603 and a current control TFT (p-channel TFT) 604 are formed on the substrate 700.

Furthermore, as was explained using FIG. 13, by providing an impurity region overlapped with the gate electrode through an insulating film, it is possible to form an n-channel TFT resistive to the deterioration resulting from hot-carrier effect. Consequently, a light emitting device with high reliability can be realized.

Meanwhile, this embodiment shows only the configuration of the pixel portion and driver circuit. However, according to the manufacturing process in this embodiment, besides these, it is possible to form on the same insulating member such logic circuits as a signal division circuit, a D/A converter, an operation amplifier, a γ-correction circuit or the like. Furthermore, a memory or microprocessor can be formed.

The light emitting device formed by the above-mentioned method has TFT formed by using the semiconductor film thoroughly annealed, because it is irradiated the laser beam that has a very excellent uniform energy distribution. Therefore, the above-mentioned light emitting device is obtained enough operation characteristic and reliability. Such a light emitting device can be used as display portions of various electronic equipments.

Incidentally, this embodiment can be freely combined with Embodiments 1 to 5.

Embodiment 8

In this embodiment, an example of performing crystallization of a semiconductor film by using an optical system will be described with reference to FIG. 1 and FIG. 17.

In this embodiment, a silicon oxynitride film (compositional ratio: Si=32%, O=59%, N=7%, H=2%) with a thickness of 400 nm is formed on a glass substrate as a base film by plasma CVD method. Subsequently, an amorphous silicon film with a thickness of 150 nm, is formed on the base film as a semiconductor film by plasma CVD method. Hydrogen contained in the semiconductor film is released by performing heat treatment at 500° C. for three hour. Then crystallization of the semiconductor film is performed by a laser annealing method. The crystallization of the semiconductor film is performed under the condition of the laser annealing method that a second harmonic wave of $YVO_4$ laser is used as a laser beam, an incident angles φ of the laser beam relative to a convex lens 103 of an optical system shown in FIG. 1 is set to 18° to form a rectangular shape beam, whereby irradiating the semiconductor film as moving the substrate at a speed of 50 cm/s.

Figure 17:
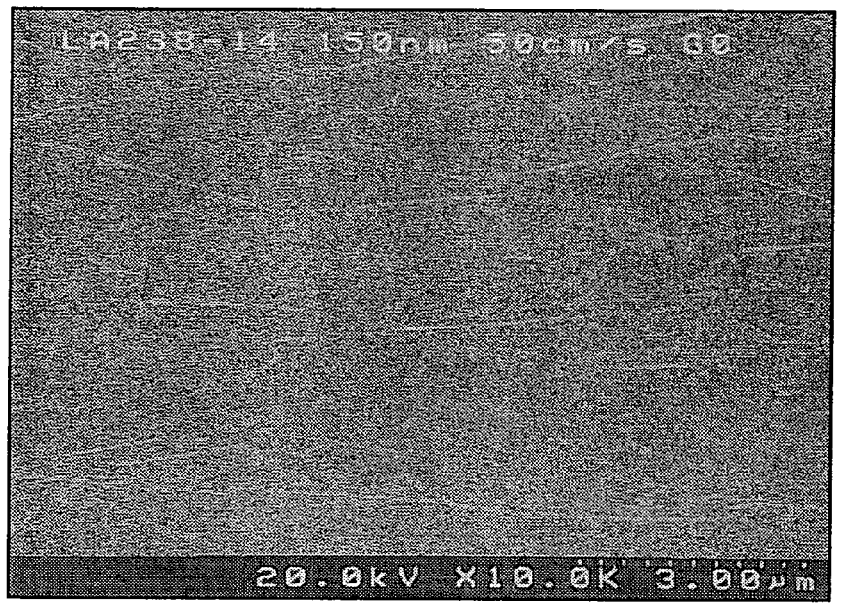
FIG. 17 is a diagram showing an example of performing a crystallization of a semiconductor film by using the present invention and observing the semiconductor film by SEM.

A seco-etching is performed to the crystalline semiconductor film thus obtained, and the result of observing the surface of the crystalline semiconductor film with a SEM (scanning electron microscopy) by one thousand times is shown in FIG. 17. Note that, the seco solution in the seco-etching is the one made by using $K_2Cr_2O_7$ for $HF:H_2O=2:1$ as an additive. FIG. 17 was obtained by relatively scanning the laser beam in the direction indicated by the arrow in figure, and FIG. 17 shows the appearance that crystal grains of large grain size is formed in a perpendicular direction relative to the scanning direction.

Therefore, since the crystal grains of large grain size are formed in the semiconductor film wherein crystallization is conducted by using the present invention, when TFT is fabricated by using the semiconductor film, the number of crystal boundaries that may be contained in a channel forming region can be reduced. Further, since an individual crystal grain has the crystallinity such that it can be regarded substantially single crystal, the high mobility (field effect mobility) equal to or more than that of a transistor using a single crystal semiconductor can be obtained.

In addition, since the formed crystal grains become complete in one direction, the number of crossing across the crystal grain boundary by a carrier can be remarkably reduced. Therefore, it is possible to reduce variations of an on current value (a value of a drain current flowing in an on state of a TFT), an off current value (a value of a drain current flowing in an off state of a TFT), a threshold voltage, an S value, and field effect mobility. And electric characteristic is extremely improved.

Embodiment 9

Figure 18:
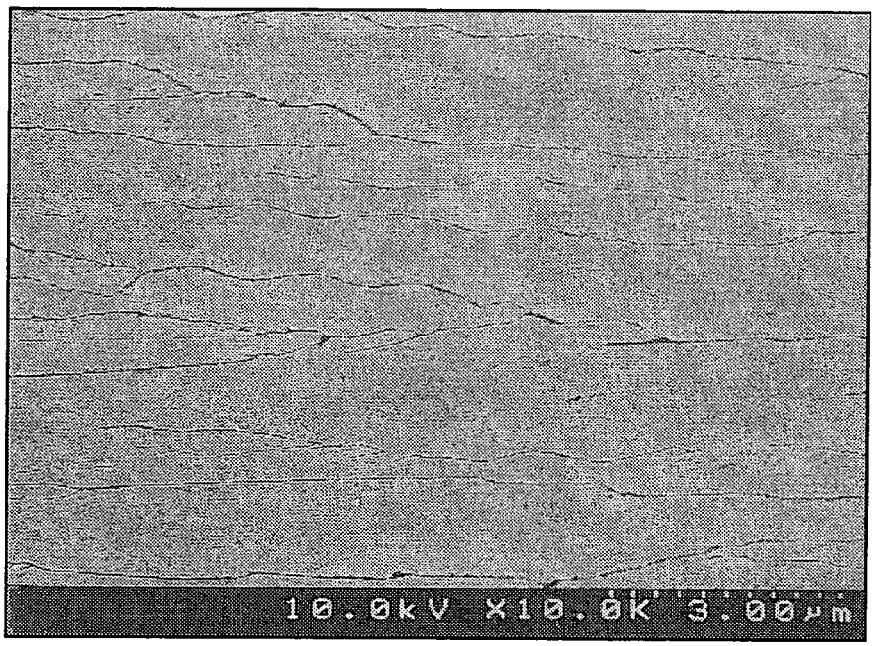
FIG. 18 is a diagram showing an example of performing a crystallization of a semiconductor film by using the present invention and observing the semiconductor film by SEM.

Present embodiment will be described an example of conducting a crystallization of a semiconductor film in the different method from Embodiment 8 with reference to FIGS. 1 and 18.

It forms to the amorphous silicon film as a semiconductor film in accordance with Embodiment 8. Further, by applying a method recorded in Japanese Patent Laid-open No. Hei 7-183540, an aqueous nickel acetate solution (weight converting concentration 5 ppm, volume 10 ml) is applied to the surface of the semiconductor film by spin coating to perform heat treatment in the nitrogen atmosphere at 500° C. for one hour and in the nitrogen atmosphere at 550° C. for twelve hour. Subsequently, an improvement of crystallinity of the semiconductor film is performed by laser annealing method. The improvement of crystallinity of the semiconductor film is performed under the condition of the laser annealing method that a second harmonic wave of $YVO_4$ laser is used as a laser beam, an incident angles φ of the laser beam relative to a convex lens 103 of an optical system shown in FIG. 1 is set to 18° to form a rectangular shape beam, whereby irradiating the semiconductor film as moving the substrate at a speed of 50 cm/s.

A seco-etching is performed to the crystalline semiconductor film thus obtained, and the surface of the crystalline semiconductor film is observed with the SEM by one thousand times. An observation result is shown in FIG. 18. The observation result in FIG. 18 was obtained by relatively scanning the laser beam in the direction indicated by the arrow in figure, and FIG. 18 shows the appearance that crystal grains of large grain size is formed in a parallel direction relative to the scanning direction. Further, it is characteristics that crystal grains shown in FIG. 18 has fewer grain boundaries formed in the direction which intersects to relative scanning direction of laser beam than that shown in FIG. 17.

Therefore, since the crystal grains of large grain size are formed in the semiconductor film wherein crystallization is conducted by using the present invention, when TFT is fabricated by using the semiconductor film, the number of crystal boundaries that may be contained in a channel forming region can be reduced. Further, since an individual crystal grain has the crystallinity such that it can be regarded substantially single crystal, the high mobility (field effect mobility) equal to or more than that of a transistor using a single crystal semiconductor can be obtained.

In addition, since the formed crystal grains become complete in one direction, the number of crossing across the crystal grain boundary by a carrier can be remarkably reduced. Therefore, it is possible to reduce variations of an on current value, an off current value, a threshold voltage, an S value, and field effect mobility. And electric characteristic is extremely improved.

Embodiment 10

Present embodiment will be described an example of conducting crystallization of a semiconductor film by using an optical system of the present invention and manufacturing TFT by using the semiconductor film with reference to FIG. 1, FIG. 19 and FIG. 20.

Figure 19A:
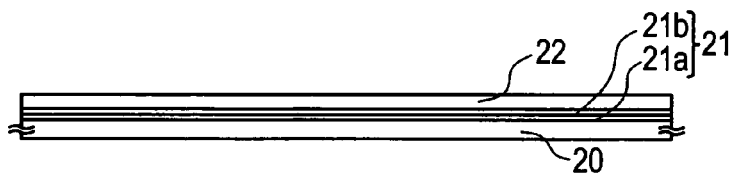
FIGS. 19A to 19H are diagrams showing examples of manufacturing TFTs by using the present invention.
Figure 19B:

In this embodiment, a glass film is used as a substrate 20, and a silicon oxynitride film (compositional ratio: Si=32%, O=27%, N=24%, H=17%) with a thickness of 50 nm, and a silicon oxynitride film (compositional ratio: Si=32%, O=59%, N=7%, H=2%) with a thickness of 100 nm are laminated on the glass substrate with plasma CVD method. Subsequently, an amorphous silicon film with a thickness of 150 nm, is formed on the base film 21 as a semiconductor film 22 by plasma CVD method. A hydrogen contained in the semiconductor film is released by performing heat treatment at 500° C. for three hour. Then, a second harmonic wave of $YVO_4$ laser is used as a laser beam, an incident angles φ of the laser beam relative to a convex lens 103 of an optical system shown in FIG. 1 is set to 18° to form a rectangular shape beam, whereby scanning the semiconductor film as moving the substrate at a speed of 50 cm/s (FIG. 19B).

Figure 19C:

Subsequently, a first doping processing is conducted. The first doping processing is a channel doping that controls a threshold value. The first doping processing is conducted by using $B_2H_6$ as a material gas, setting the gas flow rate to 30 sccm, the current density to 0.05 A, the acceleration voltage to 60 kV, and the dose to $1\times10^{14}/cm^2$ (FIG. 19C).

Figure 19D:
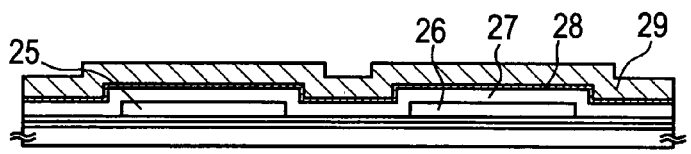

Subsequently, patterning is performed to etch a semiconductor film 24 in a predetermined shape, and then a silicon oxynitride film with a thickness of 115 nm is formed as a gate insulating film 27 covering the etched semiconductor film by the plasma CVD method. Subsequently, a TaN film 28 with a thickness of 30 nm and a W film 29 with a thickness of 370 nm as conductive films are laminated on the gate insulating film 27 (FIG. 19D).

A mask made of resist (not shown) is formed by photolithography to etch the W film, the TaN film and the gate insulating film.

Figure 19E:
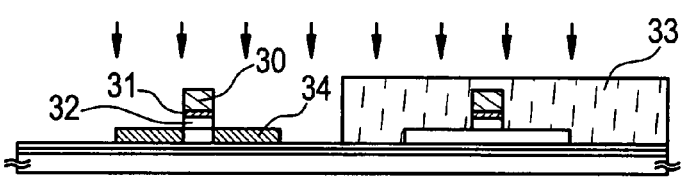

Subsequently, the mask made of a resist is removed, a new mask 33 is formed so as to conduct the second doping processing thereby introducing impurity elements which impart n-type to the semiconductor film. In this case, conductive layers 30 and 31 are become masks with respect to the impurity elements imparting n-type respectively and an impurity region 34 is formed in a self-aligning manner. In this embodiment, the second doping processing is divided into two conditions to be performed since the film thickness of the semiconductor film is very thick with 150 nm. In this embodiment, at first, the second doping processing of the first condition is performed by using phosphine ($PH_3$) as a material gas, and setting a dose to $2\times10^{13}/cm^2$ and the acceleration voltage to 90 kV. And then, the second doping processing of the second condition is performed by setting the dose to $5\times10^{14}/cm^2$ and the acceleration voltage to 10 kV (FIG. 19E).

Figure 19F:
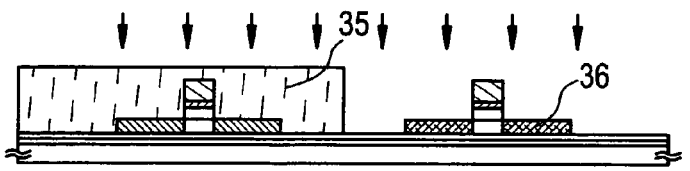

Next, the mask 33 made of a resist is removed, a new mask 35 made of resist is formed, and the third doping processing is performed. By the third doping processing, an impurity element for imparting an conductivity type opposite to the one conductivity type is added to an impurity region 36. The impurity region 36 is formed in the semiconductor film which become an active layer of the p-channel TFT. The conductive layers 30 and 31 are used as a mask to the impurity element and the impurity element for imparting a p-type is added so as to form impurity region 36 in a self-aligning manner. In this embodiment, the third doping processing is also divided into two conditions to be performed since the film thickness of the semiconductor film is very thick with 150 nm. In this embodiment, the third doping processing of the first condition is performed by using diborane ($B_2H_6$) as a material gas and setting the dose to $2\times10^{13}/cm^2$, and the acceleration voltage to 90 kV. And then, the third doping processing of the second condition is performed by setting the dose to $1\times10^{15}/cm^2$, and the acceleration voltage to 10 kV (FIG. 19F).

By the steps until now, the impurity regions 34 and 36 are formed in the respective semiconductor layers.

Next, the mask 35 made of resist is removed and a silicon oxynitride film with a thickness of 50 nm, (compositional ratio: Si=32.8%, O=63.7%, H=3.5%) is formed as a first interlayer insulating film 37 by plasma CVD method.

Figure 19G:
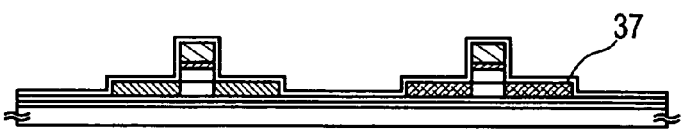

Next, a recovery of crystallinity of the semiconductor layers and an activation of the impurity element added to the respective semiconductor layers are conducted by the heat treatment. In this embodiment, the heat treatment is performed in a nitrogen atmosphere at 550° C. for four hour by a thermal annealing method using an annealing furnace (FIG. 19G).

Next, a second interlayer insulating film 38 made of organic insulating film materials or inorganic insulator materials are formed on a first interlayer insulating film 37. In this embodiment, a silicon nitride film with a thickness of 50 nm, is formed by CVD method and then a silicon oxide film with a thickness of 400 nm is formed.

Next, a hydrogenation processing can be carried out after the heat treatment. In this embodiment, the heat treatment is performed in a nitrogen atmosphere at 410° C. for one hour by using the annealing furnace.

Figure 19H:
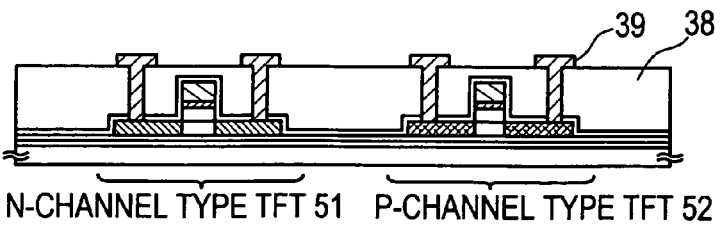

Subsequently, a wiring 39 electrically connecting to the respective impurity regions is formed. In this embodiment, a lamination film of a Ti film with a thickness of 50 nm, an Al—Si film with a thickness of 500 nm, and a Ti film with a thickness of 50 nm, is patterned to form. Of course, it is not limited to a two-layer structure, but also may be a single-layer structure or lamination structure of three layers or more. Further, materials for wirings are not limited to Al and Ti. For example, wirings may be formed by forming Al or Cu on the TaN film and patterning the lamination film on which a Ti film is formed (FIG. 19H).

As described above, an n-channel TFT 51 and a p-channel TFT 52 are formed.

Figure 20A:
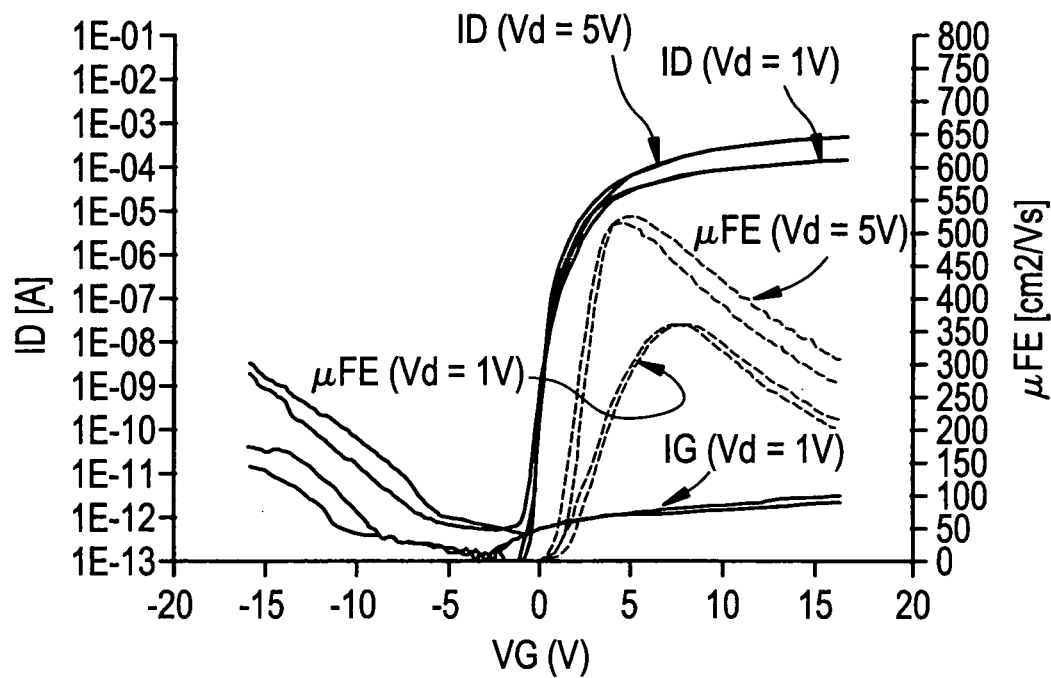
FIGS. 20A to 20B are diagrams showing examples of manufacturing TFT by using the present invention and measuring the electric characteristics.
Figure 20B:
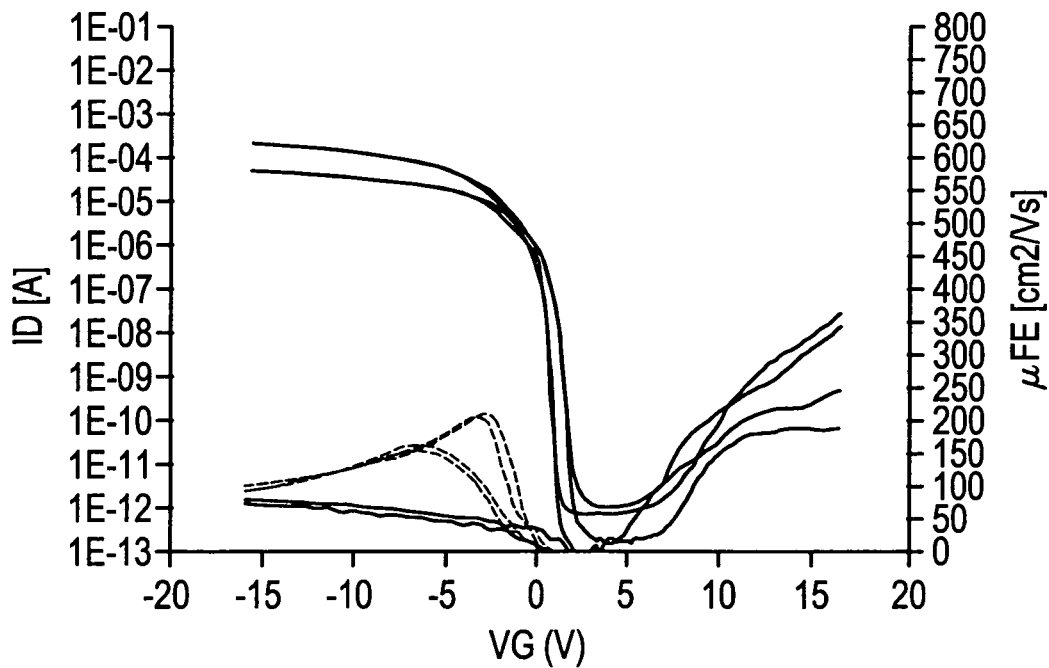

An electric characteristic of the n-channel TFT 51 is shown in FIG. 20A and an electric characteristic of the p-channel TFT 52 is shown in FIG. 20B by measuring the electric characteristics. As the measurement condition of the electric characteristics, measurement point is assumed to be two points, the gate voltage (Vg) is set to in the range of −16 to 16 V, and the drain voltage (Vd) is set to 1 V and 5 V, respectively. Moreover, in FIGS. 20A and 20B, drain current (ID) and gate current (ID) are shown in a solid line and the mobility (μFE) is shown in a dotted line.

FIGS. 20A and 20B show that the electric characteristics of TFT manufactured by using the present invention is remarkably improved. When TFT is manufactured by using the semiconductor film, the number of crystal grain boundaries that may be contained in a channel forming region can be reduced, since a crystal grain of large grain size is formed in the semiconductor film, which is crystallized by using the present invention. Furthermore, since the crystal grains are formed in the same direction, it is possible to reduce the number of crossing across the grain boundary by carrier remarkably. Therefore, the mobility is 524 cm$^2$/Vs at the n-channel TFT and the mobility is 205 cm$^2$/Vs at the p-channel TFT. When a semiconductor device is manufactured by using such TFT, the mobility characteristic and the reliability of the semiconductor device can be improved.

Embodiment 11

In this embodiment, an example of conducting crystallization of a semiconductor film by a different method from in Embodiment 10, and manufacturing TFT by using the semiconductor film will be described with reference to FIGS. 1, 21A to 21C, 22A to 22B, and 23A to 23B.

Figure 21A:
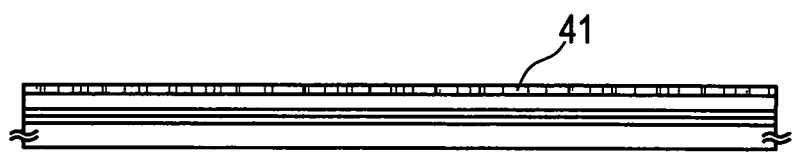
FIGS. 21A to 21C are diagrams showing examples of manufacturing TFT by using the present invention.
Figure 21B:
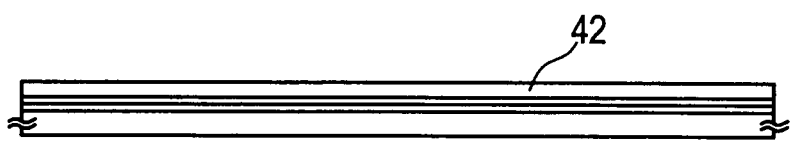
Figure 21C:
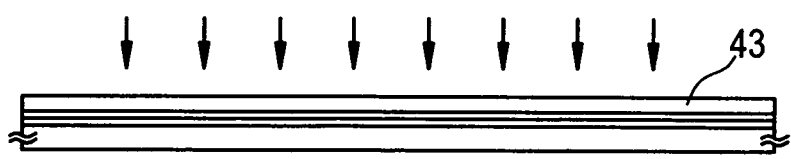

It forms to an amorphous silicon film as a semiconductor film in accordance with Embodiment 10. Further, by applying a method recorded in Japanese Patent Laid-open No. Hei 7-183540, an aqueous nickel acetate solution (weight converting concentration 5 ppm, volume 10 ml) is applied to the surface of the semiconductor film by spin coating thereby forming a metal containing layer 41. Then heat treatment is performed in the nitrogen atmosphere at 500° C. for one hour and in the nitrogen atmosphere at 550° C. for twelve hour (FIG. 21B). Subsequently, an improvement of crystallinity of the semiconductor film is performed by laser annealing method. The improvement of crystallinity of the semiconductor film is performed by the laser annealing method under the conditions that a second harmonic wave of YVO$_4$ laser is used as a laser beam, an incident angles φ of the laser beam relative to a convex lens 103 of an optical system shown in FIG. 1 is set to 18° to form a rectangular shape beam, whereby irradiating the semiconductor film as moving the substrate at a speed of 20 cm/s or 50 cm/s to improve the crystallinity of the semiconductor film (FIG. 21C).

Figure 22A:
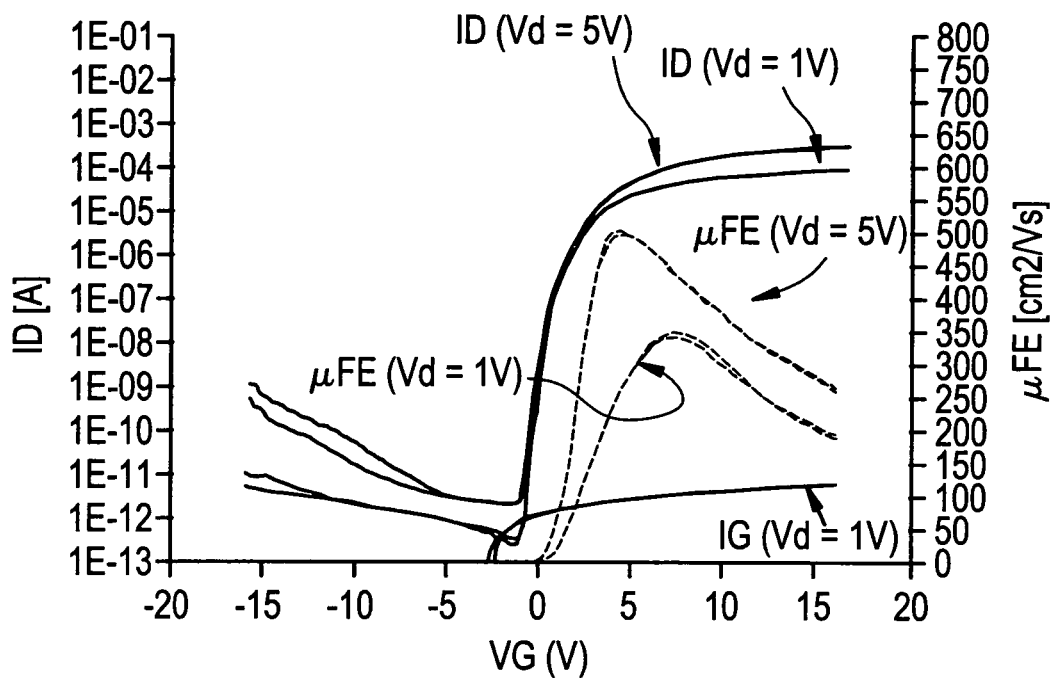
FIGS. 22A to 22B are diagrams showing examples of manufacturing TFT by using the present invention and measuring the electric characteristics.
Figure 22B:
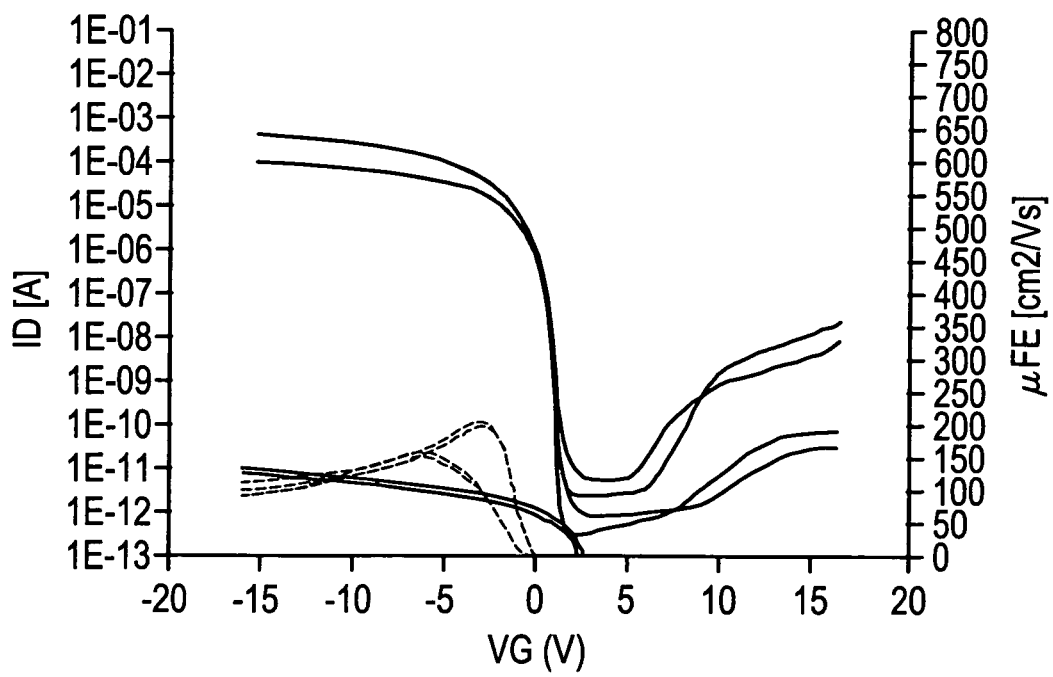
Figure 23A:
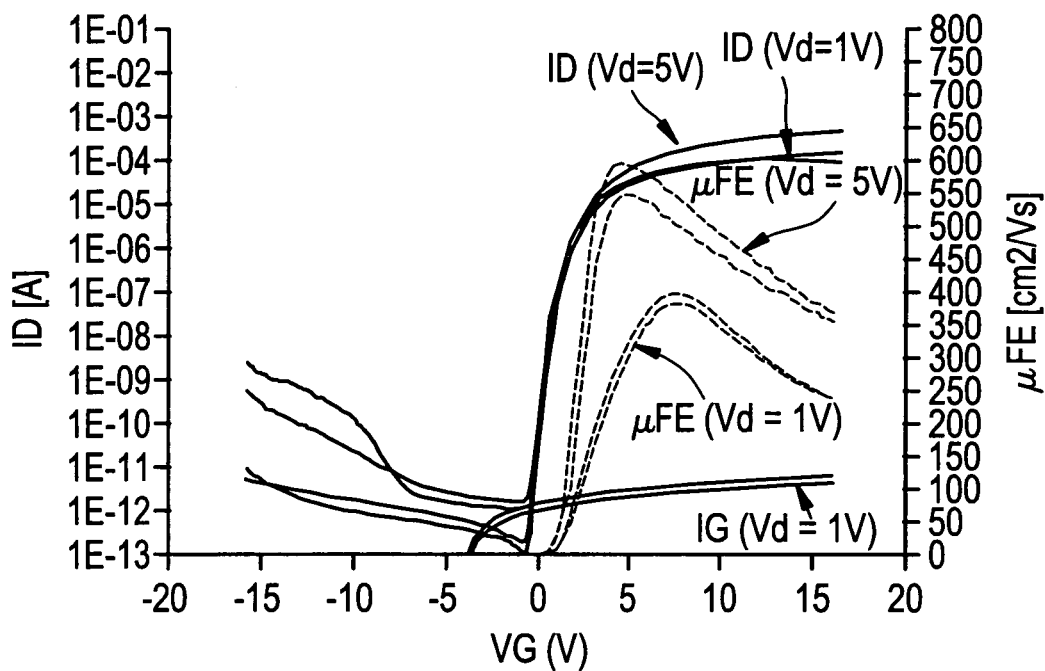
FIGS. 23A to 23B are diagrams showing examples of manufacturing TFT by using the present invention and measuring the electric characteristics.
Figure 23B:
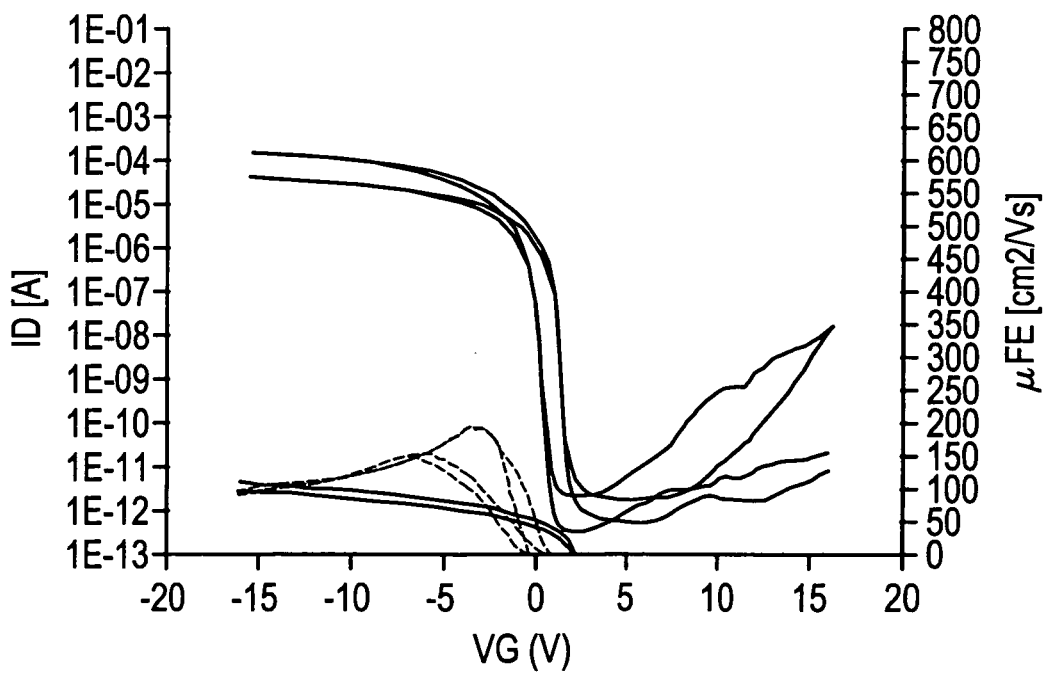

In accordance with the Embodiment 10, a n-channel TFT 51 and a p-channel TFT 52 are formed hereafter. The electric characteristics of the n-channel TFT and the p-channel TFT are measured, and then an electric characteristic of the n-channel TFT 51 manufactured by moving the substrate at a speed of 20 cm/s is shown in FIG. 22A, an electric characteristic of the p-channel TFT 52 manufactured by moving the substrate at a speed of 20 cm/s is shown in FIG. 22B, an electric characteristic of the n-channel TFT 51 manufactured by moving the substrate at a speed of 50 cm/s is shown in FIG. 23A, an electric characteristic of the p-channel TFT 52 manufactured by moving the substrate at a speed of 50 cm/s is shown in FIG. 23B, respectively, in the laser annealing step. As the measurement condition of the electric characteristics, the measurement point is assumed to be two points, the gate voltage (Vg) is set to in the range of −16 to 16 V, and the drain voltage (Vd) is set to 1.5 V. Moreover, in FIGS. 22A to 22B and FIGS. 23A to 23B, drain current (ID) and gate current (ID) is shown in solid line and the mobility (μFE) is shown in dotted line.

FIGS. 22A to 22B and FIGS. 23A to 23B show that the electric characteristics of TFT manufactured by using the present invention is remarkably improved. When TFT is manufactured by using the semiconductor film, the number of crystal grain boundaries that may be contained in a channel forming region can be reduced, since a crystal grain of large grain size is formed in the semiconductor film which is crystallized by using the present invention. Furthermore, since the formed crystal grains become complete in one direction and there are few grain boundaries formed in the direction crossed to the relative scanning direction of laser light, it is possible to reduce the number of crossing across the grain boundary by carrier remarkably. Therefore, it is understood that the mobility is 510 cm$^2$/Vs at the n-channel TFT and the mobility is 200 cm$^2$/Vs at the p-channel TFT in FIGS. 22A to 22B, and the mobility is 595 cm$^2$/Vs at the n-channel TFT and the mobility is 199 cm$^2$/Vs at the p-channel TFT in FIGS. 23A to 23B, and these mobility is very excellent. When a semiconductor device is manufactured by using such TFT, the mobility characteristic and the reliability of the semiconductor device can be improved.

Embodiment 12

In Embodiments 10 and 11, an example in which a TFT is manufactured by crystallization methods different from each other is shown. In the present Embodiment 12, difference between the crystallinities is considered from the TFT characteristics.

Figure 25A:
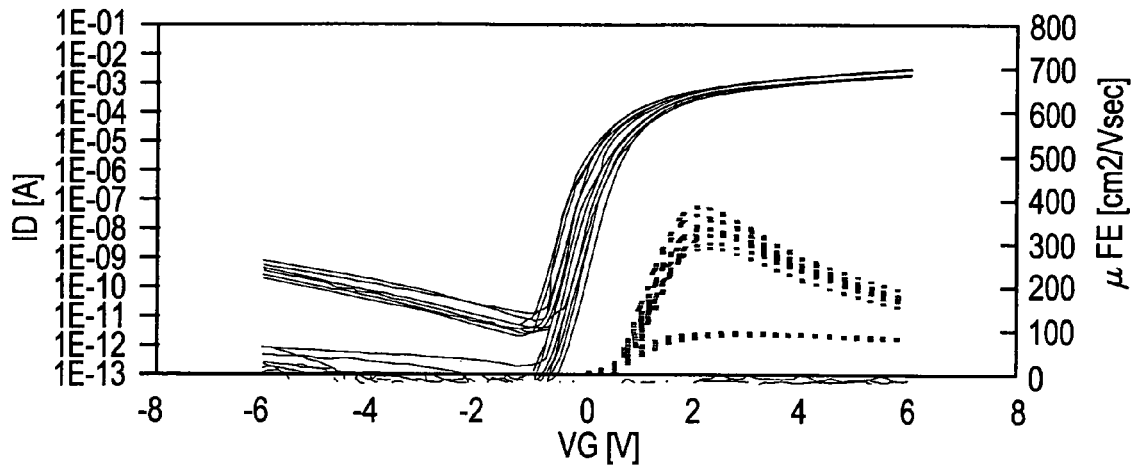
FIGS. 25A to 25C are graphs showing ID-VG characteristic of a TFT manufactured by combining laser beam irradiation with thermal crystallization using nickel having catalytic function in the crystallization and shows dependency on channel length.
Figure 25B:
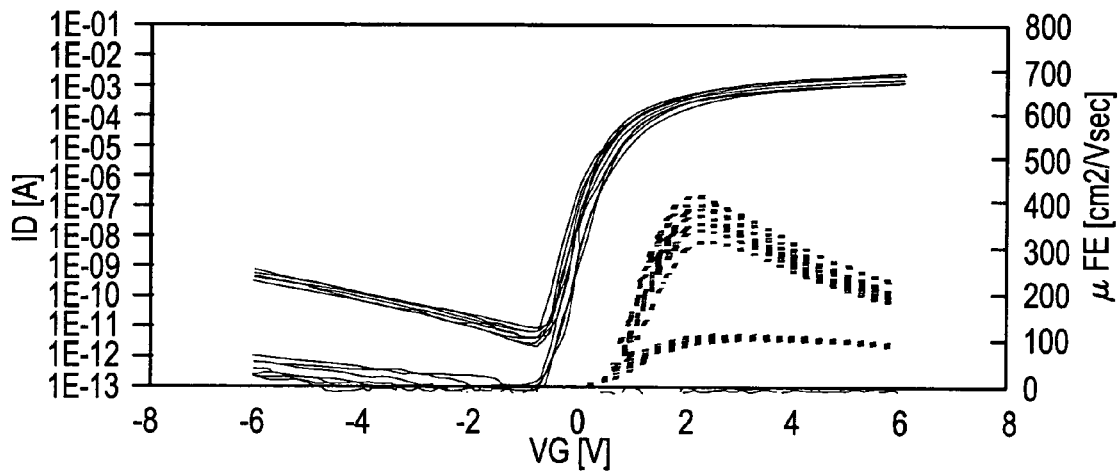
Figure 25C:
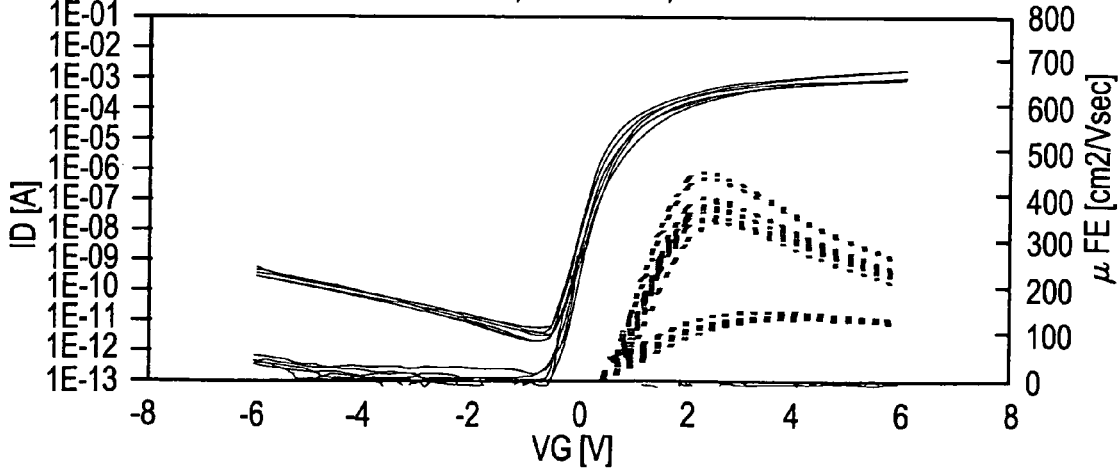
Figure 26A:
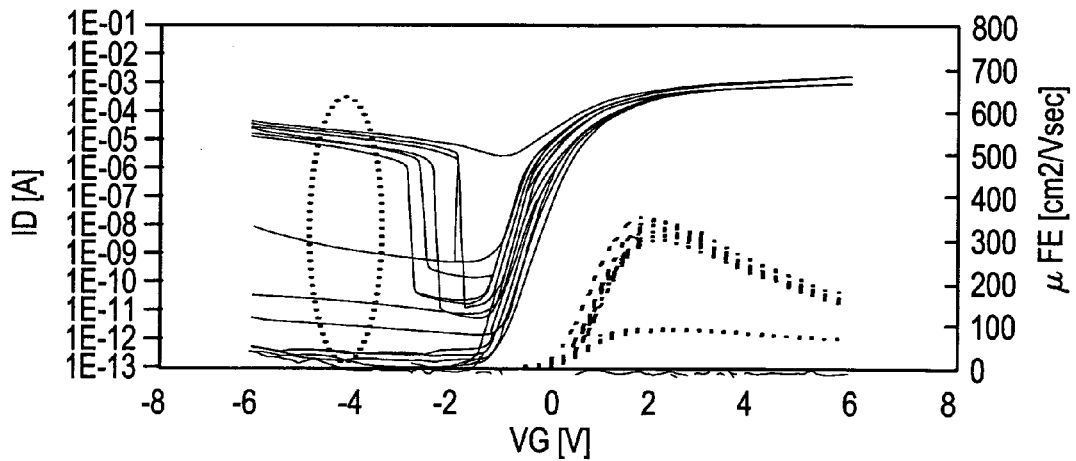
FIGS. 26A to 26C are graphs showing ID-VG characteristic of a TFT manufactured by laser beam irradiation in the crystallization and shows dependency on channel length.
Figure 26B:
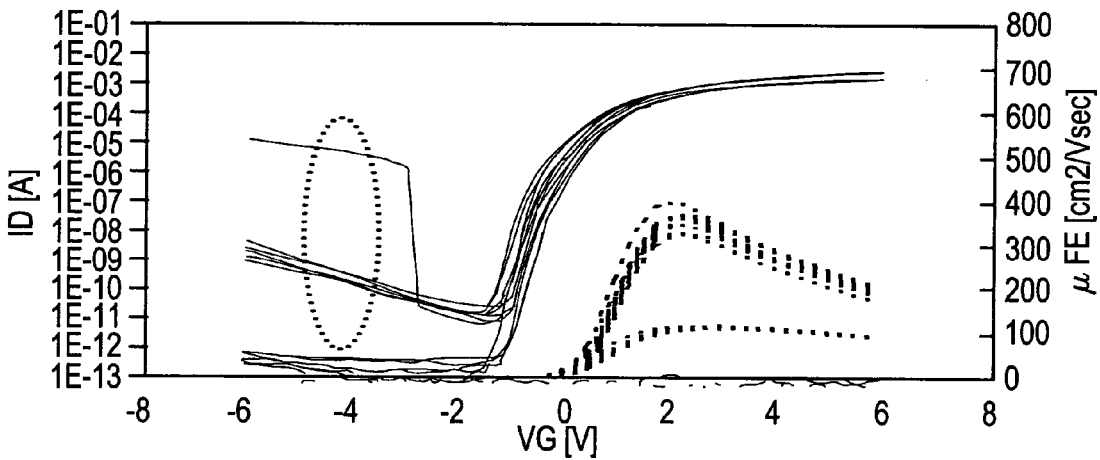
Figure 26C:
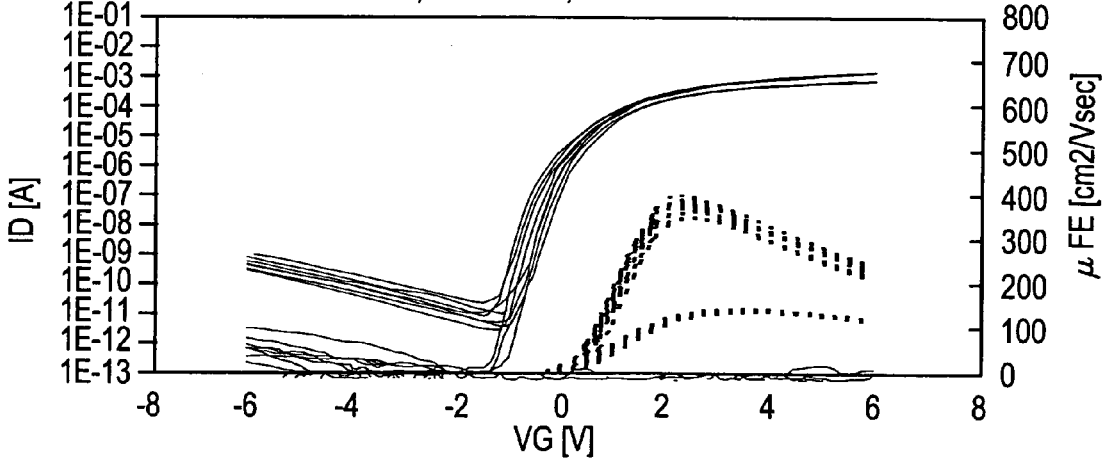

TFT (referred to as PG6 hereinafter) is manufactured according to Embodiment 11 by combination of laser beam and thermal crystallization using nickel having catalytic function in the crystallization. FIG. 25 shows dependency of drain current—gate voltage characteristic (ID-VG) of the TFT (PG6) on channel length. On the other hand, TFT (referred to as LG6 hereinafter) is manufactured by only laser beam irradiation according to Embodiment 10. FIG. 26 shows dependency of ID-VG characteristic of the TFT (LG6) on channel length. The channel length is 1.5 μm (A) and 2.0 μm (B) and 3.0 μm (C). It is to be noted that an n-channel TFT is used in any case in the present embodiment.

In FIGS. 25 and 26, the semiconductor film of the sample is 66 nm. With this thickness, it is possible to operate in complete depletion type. As apparent by comparing both the Figures, in the case where the channel length is as small as 2 μm, conspicuous difference is found in an off region. That is, in the TFT LG6, phenomenon that the drain current extraordinarily jumps up is observed. It is confirmed that this phenomenon depends on the channel dose amount. In any case, it turns out that as the channel length becomes short, PG6 becomes superior to LG6 with respect to withstand voltage between the source and the drain.

Figure 27A:
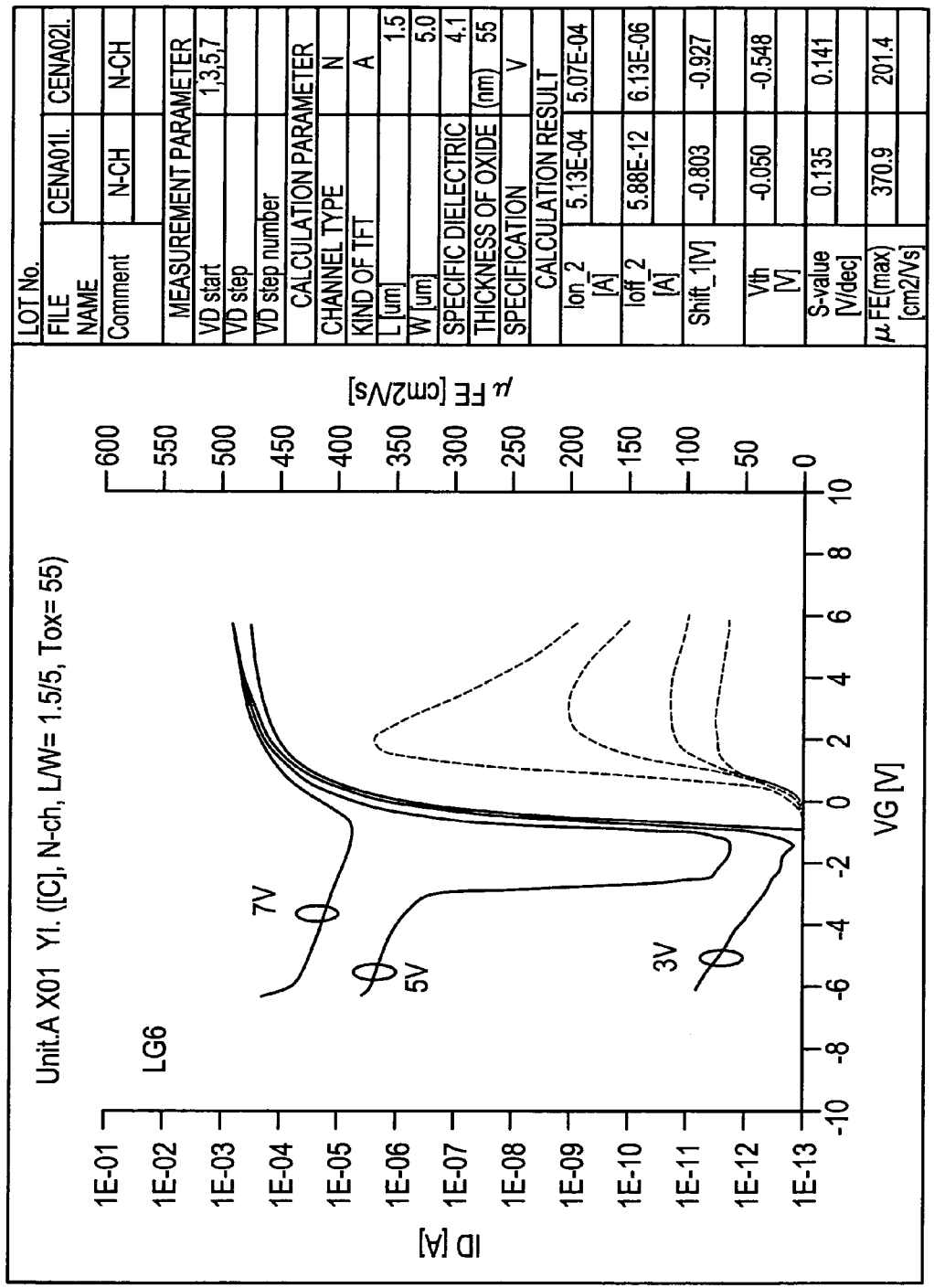
FIGS. 27A-27B are graphs showing ID-VG characteristic of a TFT with a film thickness of 66 nm in complete depression type.
Figure 27B:
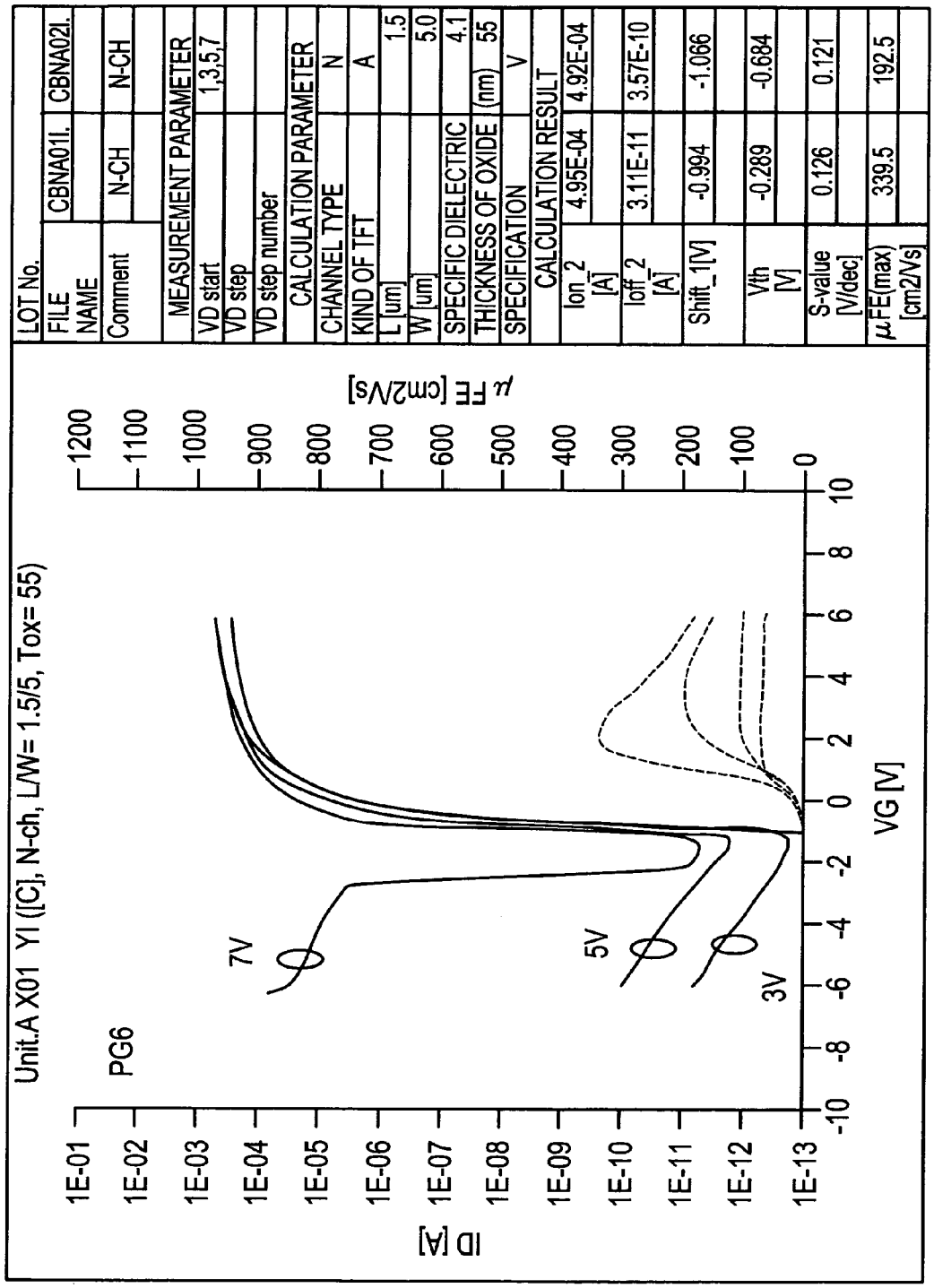
Figure 28A:
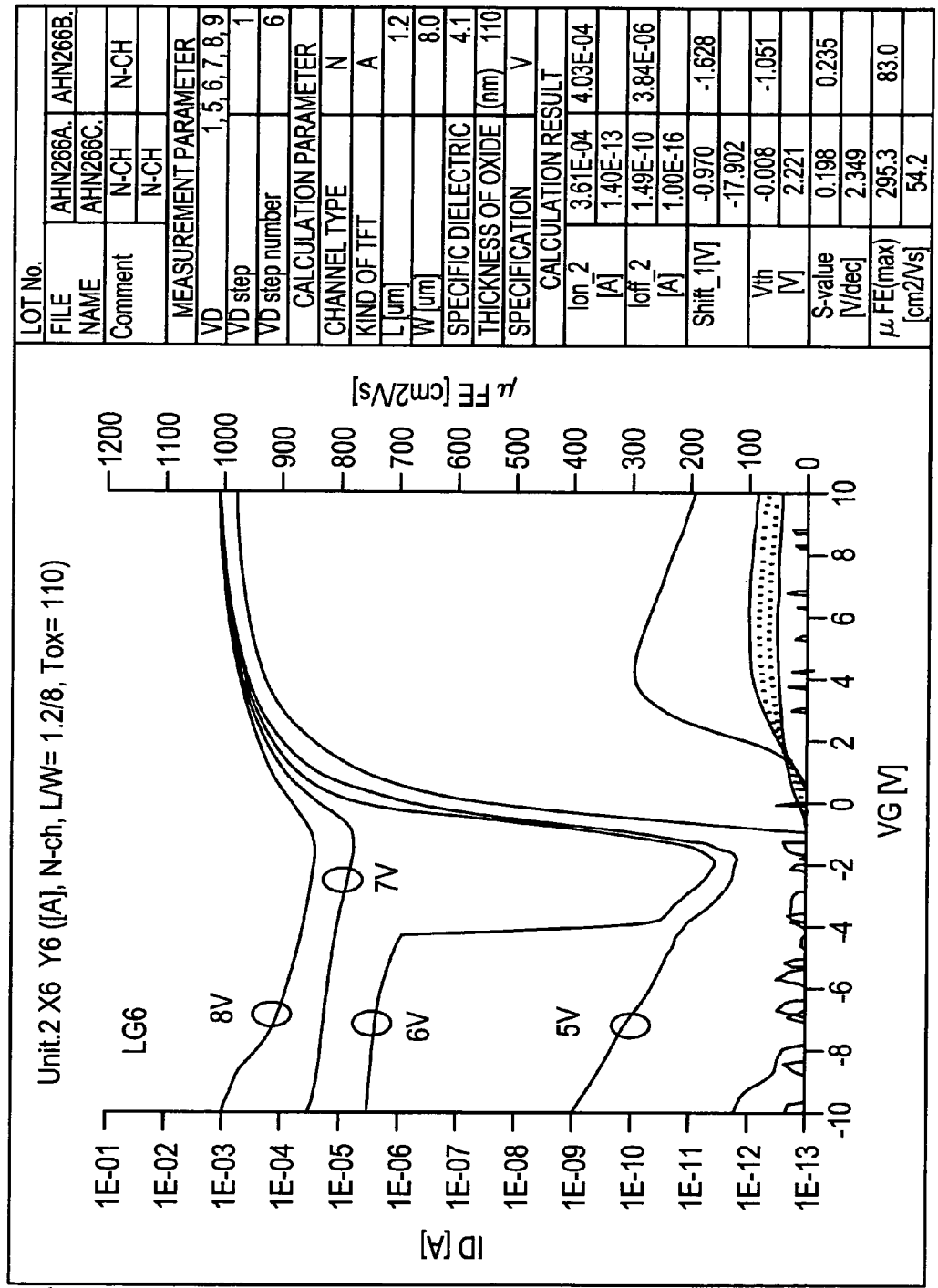
FIGS. 28A-28B are graphs showing ID-VG characteristic of a TFT with a film thickness of 150 nm in partial depletion type.
Figure 28B:
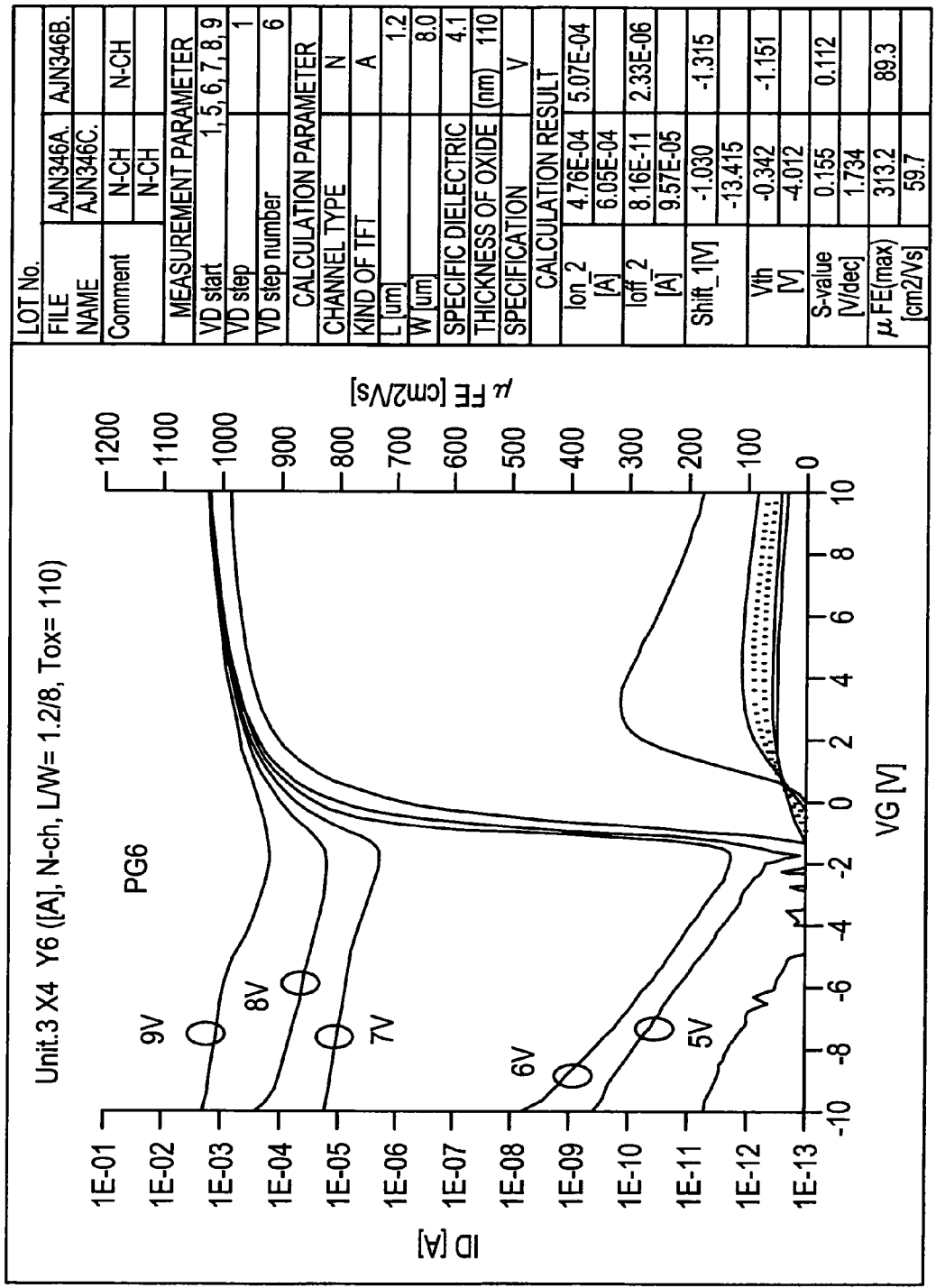

In the complete depletion type having a small thickness of the semiconductor film, a significant difference is found in the source and drain withstand voltage. Measurement is conducted to know whether similar tendency is observed in a partial depletion type having 150 nm, as thickness of the semiconductor film. In FIGS. 27 and 28, ID-VG characteristic is shown. The extraordinary jump up of the drain current in the off region is influenced by drain voltage. As the drain voltage is increased, the extraordinary jump up of the drain current is conspicuous. However, even if the influence is included in the consideration, it turns out that the PG6 is superior with respect to withstand voltage between the source and the drain. Also, it is judged in the partial depletion type that PG6 is high in withstand voltage between the source and the drain.

The above result suggests that PG6 is suitable in the case where element dimension of TFT is miniaturized into a sub-micron level.

Embodiment 13

Various semiconductor devices (active matrix type liquid crystal display device, active matrix type light emitting device or active matrix type EC display device) can be formed by applying the present invention. Specifically, the present invention can be embodied in electronic equipment of any type in which such an electro-optical device is incorporated in a display portion.

Such electronic equipment is a video camera, a digital camera, a projector, a head-mounted display (goggle type display), a car navigation system, a car stereo, a personal computer, a mobile information terminal (such as a mobile computer, a mobile telephone or an electronic book etc.) or the like. FIGS. 14A to 14F, 15A to 15D, and 16A to 16C show one of its examples.

Figure 14A:
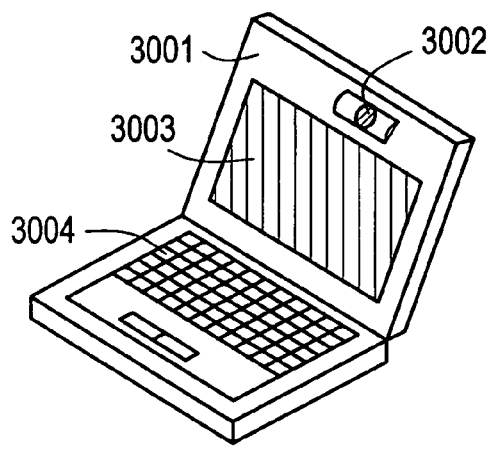
FIGS. 14A to 14F are diagrams showing examples of a semiconductor device.

FIG. 14A shows a personal computer which includes a main body 3001, an image input portion 3002, a display portion 3003, a keyboard 3004 and the like. The personal computer of the present invention can be completed by applying the semiconductor device manufactured by the present invention to the display portion 3003.

Figure 14B:
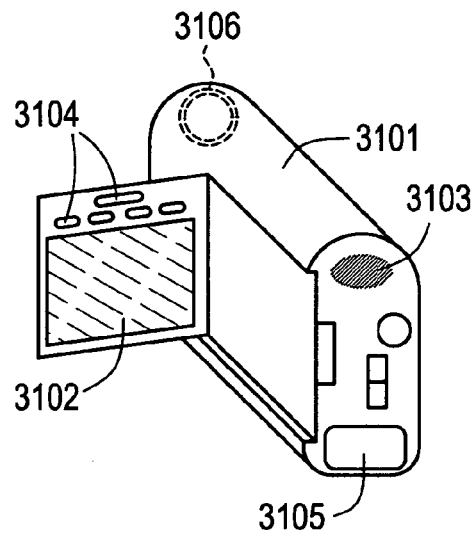

FIG. 14B shows a video camera which includes a main body 3101, a display portion 3102, a sound input portion 3103, operating switches 3104, a battery 3105, an image receiving portion 3106 and the like. The video camera of the present invention can be completed by applying the semiconductor device manufactured by the present invention to the display portion 3102.

Figure 14C:
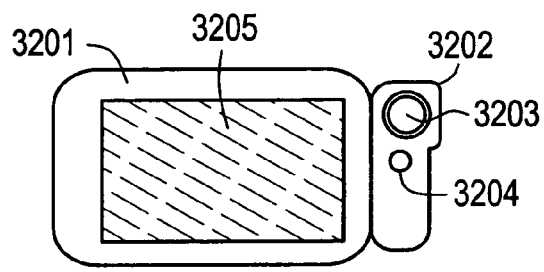

FIG. 14C shows a mobile computer which includes a main body 3201, a camera portion 3202, an image receiving portion 3203, an operating switch 3204, a display portion 3205 and the like. The mobile computer of the present invention can be completed by applying the semiconductor device manufactured by the present invention to the display portion 3205.

Figure 14D:
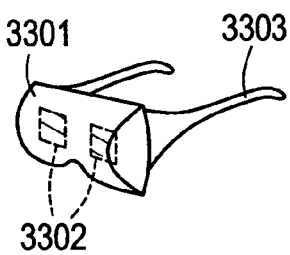

FIG. 14D shows a goggle type display which includes a main body 3301, a display portion 3302, arm portions 3303 and the like. The goggle type display of the present invention can be completed by applying the semiconductor device manufactured by the present invention to the display portion 3302.

Figure 14E:
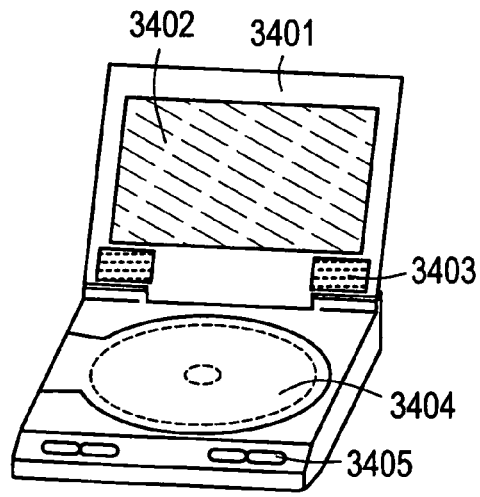

FIG. 14E shows a player using a recording medium on which a program is recorded (hereinafter referred to as the recording medium), and the player includes a main body 3401, a display portion 3402, speaker portions 3403, a recording medium 3404, operating switches 3405 and the like. This player uses a DVD (Digital Versatile Disc), a CD and the like as the recording medium, and enables a user to enjoy music, movies, games and the Internet. The recording medium of the present invention can be completed by applying the semiconductor device manufactured by the present invention to the display portion 3402.

Figure 14F:
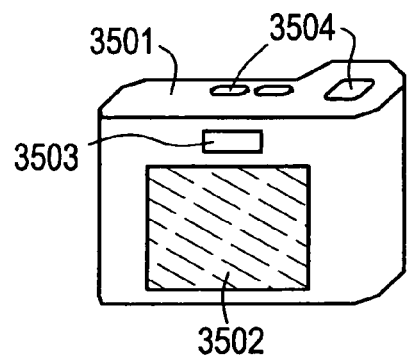

FIG. 14F shows a digital camera which includes a body 3501, a display portion 3502, an eyepiece portion 3503, operating switches 3504, an image receiving portion (not shown) and the like. The digital camera of the present invention can be completed by applying the semiconductor device manufactured by the present invention to the display portion 3502.

Figure 15A:
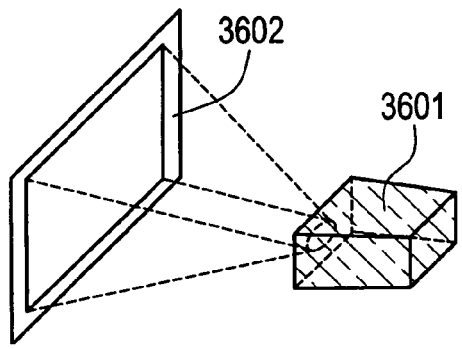
FIGS. 15A to 15D are diagrams showing examples of a semiconductor device.

FIG. 15A shows a front type projector which includes a projection device 3601, a screen 3602 and the like. The front type projector can be completed by applying a liquid crystal display device 3808 which constitutes a part of the projection device 3601 and other driver circuits.

Figure 15B:
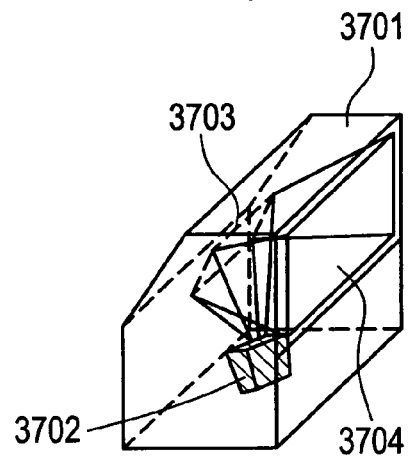

FIG. 15B shows a rear type projector which includes a main body 3701, a projection device 3702, a mirror 3703, a screen 3704 and the like. The rear type projector can be completed by applying the liquid crystal display device 3808 which constitutes a part of the projection device 3702 and other driver circuits.

Figure 15C:
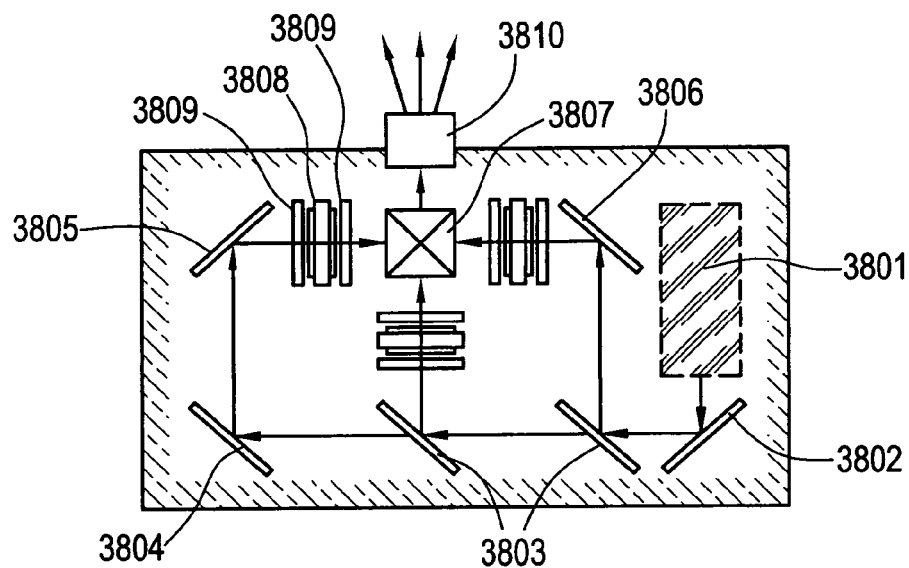

FIG. 15C shows one example of the structure of each of the projection devices 3601 and 3702 which are respectively shown in FIGS. 15A and 15B. Each of the projection devices 3601 and 3702 is made of a light source optical system 3801, mirrors 3802 and 3804 to 3806, a dichroic mirror 3803, a prism 3807, a liquid crystal display device 3808, a phase difference plate 3809 and a projection optical system 3810. The projection optical system 3810 is made of an optical system including a projection lens. Present embodiment is an example of a three-plate type, but it is not limited to this example and may also be of a single-plate type. In addition, those who embody the invention may appropriately dispose an optical system such as an optical lens, a film having a polarization function, a film for adjusting phase difference, an IR film or the like in the path indicated by arrows in FIG. 15C.

Figure 15D:
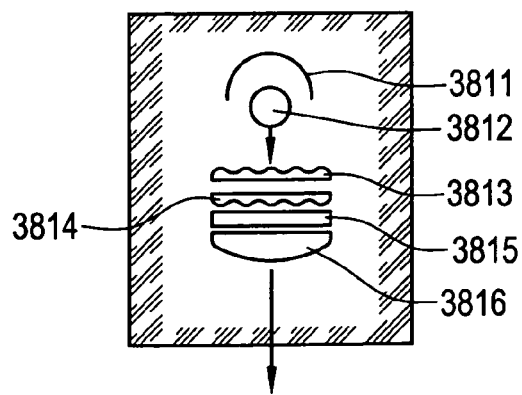

FIG. 15D is a view showing one example of the structure of the light source optical system 3801 shown in FIG. 15C. In this embodiment, the light source optical system 3801 is made of a reflector 3811, a light source 3812, lens arrays 3813 and 3814, a polarizing conversion element 3815 and a condenser lens 3816. Incidentally, the light source optical system shown in FIG. 15D is one example, and the invention is not particularly limited to the shown construction. For example, those whose embody the invention may appropriately dispose an optical system such as an optical lens, a film having a polarization function, a film for adjusting phase difference, an IR film or the like.

The projector shown in FIGS. 15A to 15D is of the type using a transparent type of electro-optical device, but there is not shown an example in which the invention is applied to a reflection type of electro-optical device and a light emitting device.

Figure 16A:
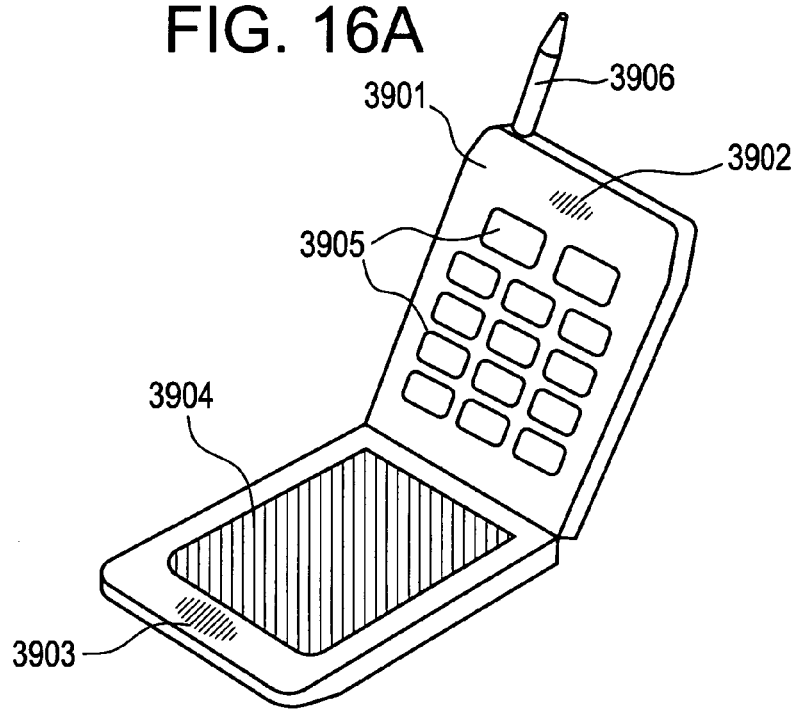
FIGS. 16A to 16C are diagrams showing examples of a semiconductor device.

FIG. 16A shows a mobile telephone which includes a main body 3901, a sound output portion 3902, a sound input portion 3903, a display portion 3904, operating switches 3905, an antenna 3906 and the like. The mobile telephone of the present invention can be completed by applying the semiconductor device manufactured by the present invention to the display portion 3904.

Figure 16B:
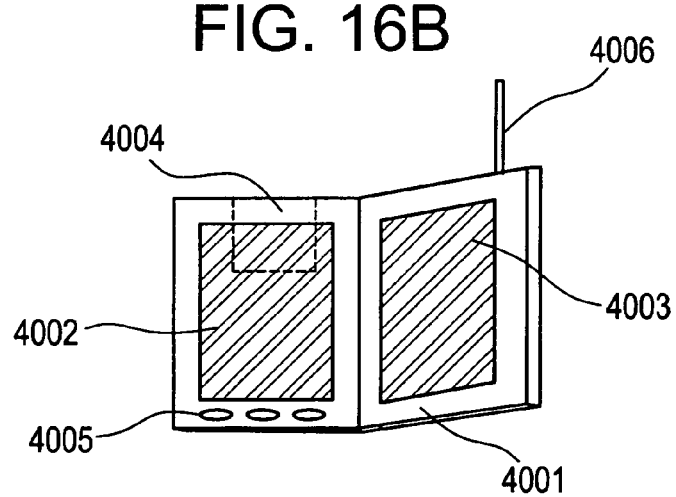

FIG. 16B shows a mobile book (electronic book) which includes a main body 4001, display portions 4002 and 4003, a storage medium 4004, operating switches 4005, an antenna 4006 and the like. The mobile book of the present invention can be completed by applying the semiconductor device manufactured by the present invention to the display portions 4002 and 4003.

Figure 16C:
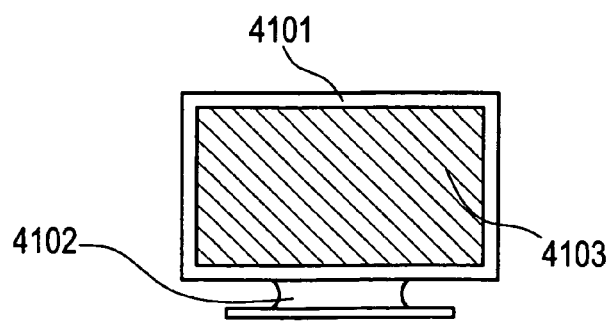

FIG. 16C shows a display which includes a main body 4101, a support base 4102, a display portion 4103 and the like. The display of the present invention can be completed by applying the semiconductor device manufactured by the present invention to the display portion 4103. The invention is particularly advantageous to a large-screen display, and is advantageous to a display having a diagonal size of 10 inches or more (particularly, 30 inches or more).

As is apparent from the foregoing description, the range of applications of the invention is extremely wide, and the invention can be applied to any category of electronic apparatus. Electronic apparatus according to the invention can be realized by using a construction made of a combination of arbitrary ones of Embodiments 1 to 6 and 8 to 11 or Embodiments 1 to 5 and 7 to 11.

Embodiment 14

In the present Embodiment, an example in which a linear beam is formed using a diffractive optics (diffraction grating) instead of the convex lens used in Embodiment 1 will be described below with reference to FIG. 24.

Figure 24:
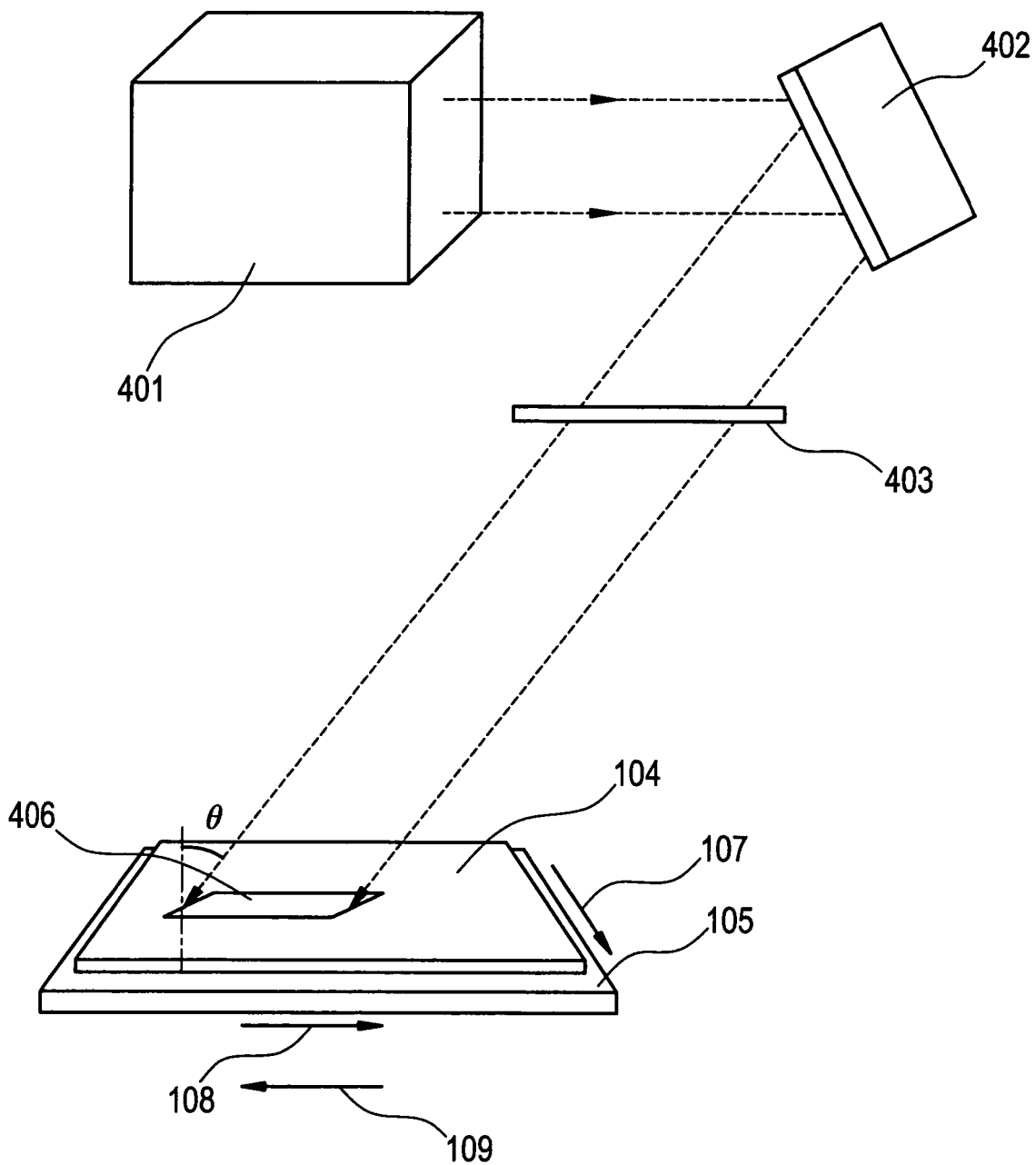
FIG. 24 is a diagram showing an example of an optical system of the present invention.

In FIG. 24, a laser 401, a mirror 402, a diffractive optics 403, a linear beam 406, a non-irradiated body 104 and a glass substrate 105 are depicted. Moreover, the reference numerals 107, 108 and 109 denote the directions in which the substrate is moved. When the laser beam emitted from the laser 401 is incident into the diffractive optics 403 via the mirror 402, the linear beam 406 can be formed on the irradiation surface or in its neighborhood. The shape of the linear beam may be formed by appropriately designing the diffractive optics. Moreover, if the linear beam is slantly incident into the irradiation surface, the interference can be prevented.

It should be noted that a beam expander is set between the laser 401 and the mirror 402, or between the mirror 402 and the diffractive optics 403, and may be expanded into the desired sizes in both of the longer direction and the shorter direction, respectively. Moreover, the mirror may not be set, or a plurality of mirrors may be set.

Then, while the linear beam formed in this way irradiates, it can irradiate the desired region or whole area on the irradiated body 104 by being relatively moved with respect to the irradiated body 104, for example, in the direction indicated with the reference numeral 107 or the directions indicated with the reference numerals 108, 109.

Since in the present invention, the optical system for forming the linear beam has a very simple configuration, it is easy to make a plurality of laser beams linear beams having the same shape on the irradiation surface. Therefore, since the same annealing is carried out in any region where any linear beam irradiates, the whole surface of the irradiated body reaches to have a uniform physical property and the throughput is enhanced. It should be noted that in Embodiments 2-4, as in the present Embodiment, the diffractive optics could be used instead of the convex lens.

It should be noted that the optical system of the present Embodiment could be freely combined with Embodiments 5 through 7.

The fundamental significances indicated as follows can be obtained by employing a configuration of the present invention:

(a) Since it is a very simplified configuration, the optical adjustment is easy and the device becomes compact in size. Similarly in the case where a plurality of lasers of the same kind or a plurality of lasers of different kinds are used, the optical adjustment is easy, and the device becomes compact in size.

(b) Since being slantly incident with respect to a plurality of lasers, the return beam can be prevented, and it becomes a simpler configuration.

(c) Even in the case where the irradiation of laser is carried out using a plurality of laser beams, since the optical system is simplified, it is capable of easily making the same shapes of the all laser beams. Therefore, uniform annealing can be carried out to the irradiated body. This is particularly effective in the case where a substrate has a large area.

(d) It greatly simplifies synthesis of a plurality of laser beams. Therefore, even if it is a laser having a lower output, it is sufficiently applicable by employing a plurality of these.

(e) The throughput is capable of being enhanced.

(f) While satisfying these advantages described above, still more, the enhancement of the operating property and reliability of a semiconductor device can be realized in a semiconductor device represented by an active matrix type crystal display device. Furthermore, the reduction of the manufacturing cost of the semiconductor device can be realized.

What is claimed is:

1. A laser irradiation device comprising:
    a first laser of continuous oscillation and a second laser of continuous oscillation; and
    a first convex lens and a second convex lens,
    wherein said first convex lens is slantly set with respect to a first laser beam emitted from said first laser and disposed in parallel with an irradiation surface over a substrate and said second convex lens is slantly set with respect to a second laser beam emitted from said second laser and disposed in parallel with the irradiation surface, and
    wherein said irradiation surface is set so that a third laser beam traveled via said first convex lens and a fourth laser beam traveled via said second convex lens are slantly incident with respect to said irradiation surface and said third laser beam and said fourth laser beam are superimposing at least partly on said irradiation surface.

2. A device according to claim 1, wherein each of said first convex lens and said second convex lens is an aspherical lens.

3. A device according to claim 1, wherein each of said first laser and said second laser is a solid state laser, a gas laser or a metal laser.

4. A device according to claim 1, wherein each of said first laser and said second laser is one selected from YAG laser, $YVO_4$ laser, YLF laser, $YAlO_3$ laser, glass laser, ruby laser, alexandrite laser, and Ti: sapphire laser.

5. A device according to claim 1, wherein each of said first laser and said second laser is one selected from Ar laser, Kr laser and $CO_2$ laser.

6. A device according to claim 1, wherein each of said first laser and said second laser is one selected from helium-cadmium laser, copper vapor laser and gold vapor laser.

7. A device according to claim 1, wherein each of said first laser beam and said second laser beam is converted into a higher harmonic wave using a non-linear optical element.

8. A laser irradiation device comprising:
a first laser of continuous oscillation and a second laser of continuous oscillation; and
a first convex lens and a second convex lens,
wherein said first convex lens is slantly set with respect to a first laser beam emitted from said first laser and disposed in parallel with an irradiation surface over a substrate and said second convex lens is slantly set with respect to a second laser beam emitted from said second laser and disposed in parallel with the irradiation surface,
wherein said irradiation surface is set so that a third laser beam traveled via said first convex lens and a fourth laser beam traveled via said second convex lens are slantly incident with respect to said irradiation surface and said third laser beam and said fourth laser beam are superimposing at least partly on said irradiation surface, and
wherein a shape of said third laser beam is deformed through said first convex lens and a shape of said fourth laser beam is deformed through said second convex lens so that each of said shape of said third laser beam and said shape of said fourth laser beam is in a linear shape on said irradiation surface.

9. A device according to claim 8, wherein each of said first convex lens and said second convex lens is an aspherical lens.

10. A device according to claim 8, wherein each of said first laser and said second laser is a solid state laser, a gas laser or a metal laser.

11. A device according to claim 8, wherein each of said first laser and said second laser is one selected from YAG laser, YVO$_4$ laser, YLF laser, YAlO$_3$ laser, glass laser, ruby laser, alexandrite laser, and Ti: sapphire laser.

12. A device according to claim 8, wherein each of said first laser and said second laser is one selected from Ar laser, Kr laser and CO$_2$ laser.

13. A device according to claim 8, wherein each of said first laser and said second laser is one selected from helium-cadmium laser, copper vapor laser and gold vapor laser.

14. A device according to claim 8, wherein each of said first laser beam and said second laser beam is converted into a higher harmonic wave using a non-linear optical element.

15. A laser irradiation device comprising:
a first laser and a second laser; and
a first convex lens and a second convex lens,
wherein said first convex lens is slantly set with respect to a first laser beam emitted from said first laser and disposed in parallel with an irradiation surface over a substrate and said second convex lens is slantly set with respect to a second laser beam emitted from said second laser and disposed in parallel with the irradiation surface,
wherein said irradiation surface is set so that a third laser beam traveled via said first convex lens and a fourth laser beam traveled via said second convex lens are slantly incident with respect to said irradiation surface and said third laser beam and said fourth laser beam are superimposing at least partly on said irradiation surface, and
wherein a shape of said third laser beam is deformed through said first convex lens and a shape of said fourth laser beam is deformed through said second convex lens so that each of said shape of said third laser beam and said shape of said fourth laser beam is in a linear shape on said irradiation surface, and
wherein a first beam length w1 of said third laser beam incident into said irradiation surface and a second beam length w2 of said fourth laser beam incident into said irradiation surface, thickness d of said substrate, and a first incident angle θ1 of said third laser beam at which angle said third laser beam is incident with respect to said irradiation surface and a second incident angle θ2 of said fourth laser beam at which angle said fourth laser beam is incident with respect to said irradiation surface satisfy the following expression:

$$\theta 1 \geq \arctan(w1/(2 \times d))$$

and $$\theta 2 \geq \arctan(w2/(2 \times d)).$$

16. A device according to claim 15, wherein each of said first convex lens and said second convex lens is an aspherical lens.

17. A device according to claim 15, wherein each of said first laser and said second laser is a solid state laser, a gas laser or a metal laser of continuous oscillation or pulse oscillation.

18. A device according to claim 15, wherein each of said first laser and said second laser is one selected from YAG laser, YVO$_4$ laser, YLF laser, YAlO$_3$ laser, glass laser, ruby laser, alexandrite laser, and Ti: sapphire laser of continuous oscillation or pulse oscillation.

19. A device according to claim 15, wherein each of said first laser and said second laser is one selected from Ar laser, Kr laser and CO$_2$ laser.

20. A device according to claim 15, wherein each of said first laser and said second laser is one selected from helium-cadmium laser, copper vapor laser and gold vapor laser of continuous oscillation or pulse oscillation.

21. A device according to claim 15, wherein each of said first laser beam and said second laser beam is converted into a higher harmonic wave using a non-linear optical element.

22. A device according to claim 15 wherein each of said first incident angle θ1 and said second incident angle θ2 is Brewster's angle.

23. A laser irradiation method comprising:
emitting a first laser beam from a first laser and a second laser beam from a second laser,
making said first laser beam slantly incident with respect to a first convex lens slantly set with respect to said first laser beam and disposed in parallel with an irradiation surface over a substrate and said second laser beam slantly incident with respect to a second convex lens slantly set with respect to said second laser beam and disposed in parallel with said irradiation surface,
setting said irradiation surface so that a third laser beam traveled via said first convex lens is slantly incident with respect to said irradiation surface and a fourth laser beam traveled via said second convex lens is slantly incident with respect to said irradiation surface,
deforming a first shape of said third laser beam through said first convex lens so that said first shape of said third laser beam is in a first linear shape on said irradiation surface and a second shape of said fourth laser beam through said second convex lens so that said second shape of said fourth laser beam is a second linear shape, and
irradiating said third laser beam and said fourth laser beam to said irradiation surface so as to superpose at least partly while said third laser beam and said fourth laser beam and said irradiation surface are relatively moved.

24. A method according to claim 23, wherein each of said first convex lens and said second convex lens is an aspherical lens.

25. A method according to claim 23, wherein each of said first laser and said second laser is a solid state laser, a gas laser or a metal laser.

26. A method according to claim 23, wherein each of said first laser and said second laser is one selected from YAG laser, $YVO_4$ laser, YLF laser, $YAlO_3$ laser, glass laser, ruby laser, alexandrite laser, and Ti: sapphire laser.

27. A method according to claim 23, wherein each of said first laser and said second laser is one selected from Ar laser, Kr laser and $CO_2$ laser.

28. A method according to claim 23, wherein each of said first laser and said second laser is one selected from helium-cadmium laser, copper vapor laser and gold vapor laser.

29. A method according to claim 23, wherein each of said first laser beam and said second laser beam is converted into a higher harmonic wave using a non-linear optical element.

30. A laser irradiation method comprising:
emitting a first laser beam from a first laser of continuous oscillation and a second laser beam from a second laser of continuous oscillation,
making said first laser beam slantly incident with respect to a first convex lens slantly set with respect to said first laser beam and disposed in parallel with an irradiation surface over a substrate and said second laser beam slantly incident with respect to a second convex lens slantly set with respect to said second laser beam and disposed in parallel with said irradiation surface,
setting said irradiation surface so that a third laser beam traveled via said first convex lens is slantly incident with respect to said irradiation surface and a fourth laser beam traveled via said second convex lens is slantly incident with respect to said irradiation surface,
deforming a first shape of said third laser beam through said first convex lens so that said first shape of said third laser beam is in a first linear shape on said irradiation surface and a second shape of said fourth laser beam through said second convex lens so that said second shape of said fourth laser beam is a second linear shape, and
irradiating said third laser beam and said fourth laser beam to said irradiation surface so as to superpose at least partly while said third laser beam and said fourth laser beam and said irradiation surface are relatively moved.

31. A method according to claim 30, wherein each of said first convex lens and said second convex lens is an aspherical lens.

32. A method according to claim 30, wherein each of said first laser and said second laser is a solid state laser, a gas laser or a metal laser.

33. A method according to claim 30, wherein each of said first laser and said second laser is one selected from YAG laser, $YVO_4$ laser, YLF laser, $YAlO_3$ laser, glass laser, ruby laser, alexandrite laser, and Ti: sapphire laser.

34. A method according to claim 30, wherein each of said first laser and said second laser is one selected from Ar laser, Kr laser and $CO_2$ laser.

35. A method according to claim 30, wherein each of said first laser and said second laser is one selected from helium-cadmium laser, copper vapor laser and gold vapor laser.

36. A method according to claim 30, wherein each of said first laser beam and said second laser beam is converted into a higher harmonic wave using a non-linear optical element.

37. A laser irradiation method comprising:
emitting a first laser beam from a first laser and a second laser beam from a second laser,
making said first laser beam slantly incident with respect to a first convex lens slantly set with respect to said first laser beam and disposed in parallel with an irradiation surface over a substrate and said second laser beam slantly incident with respect to a second convex lens slantly set with respect to said second laser beam and disposed in parallel with said irradiation surface,
deforming a first shape of a third laser beam through said first convex lens so that said first shape of said third laser beam is in a first linear shape on said irradiation surface and a second shape of a fourth laser beam through said second convex lens so that said second shape of said fourth laser beam is a second linear shape, and
irradiating said third laser beam and said fourth laser beam to said irradiation surface so as to superpose at least partly while said third laser beam and said fourth laser beam and said irradiation surface are relatively moved,
wherein a first beam length w1 of said third laser beam incident into said irradiation surface and a second beam length w2 of said fourth laser beam incident into said irradiation surface, thickness d of said substrate, and a first incident angle θ1 of said third laser beam at which angle said third laser beam is incident with respect to said irradiation surface and a second incident angle θ2 of said fourth laser beam at which angle said fourth laser beam is incident with respect to said irradiation surface satisfy the following expression:

θ1≥arctan $(w1/(2\times d))$ and

θ2≥arctan $(w2/(2\times d))$.

38. A method according to claim 37, wherein each of said first convex lens and said second convex lens is an aspherical lens.

39. A method according to claim 37, wherein each of said first laser and said second laser is a solid state laser, a gas laser or a metal laser.

40. A method according to claim 37, wherein each of said first laser and said second laser is one selected from YAG laser, $YVO_4$ laser, YLF laser, $YAlO_3$ laser, glass laser, ruby laser, alexandrite laser, and Ti: sapphire laser of continuous oscillation or pulse oscillation.

41. A method according to claim 37, wherein each of said first laser and said second laser is one selected from Ar laser, Kr laser and $CO_2$ laser.

42. A method according to claim 37, wherein each of said first laser and said second laser is one selected from helium-cadmium laser, copper vapor laser and gold vapor laser of continuous oscillation or pulse oscillation.

43. A method according to claim 37, wherein each of said first laser beam and said second laser beam is converted into a higher harmonic wave using a non-linear optical element.

* * * * *